United States Patent
Koller et al.

(10) Patent No.: US 12,249,553 B2
(45) Date of Patent: Mar. 11, 2025

(54) THERMAL CONTACTS AT PERIPHERY OF INTEGRATED CIRCUIT PACKAGES

(71) Applicant: Intel IP Corporation, Santa Clara, CA (US)

(72) Inventors: Sonja Koller, Regensburg (DE); Vishnu Prasad, Munich (DE); Georg Seidemann, Landshut (DE)

(73) Assignee: Intel Corporation, Santa Clara, CA (US)

( * ) Notice: Subject to any disclaimer, the term of this patent is extended or adjusted under 35 U.S.C. 154(b) by 1517 days.

(21) Appl. No.: 16/015,334

(22) Filed: Jun. 22, 2018

(65) Prior Publication Data
US 2019/0393125 A1    Dec. 26, 2019

(51) Int. Cl.
H01L 23/367    (2006.01)
H01L 21/56     (2006.01)
H01L 23/31     (2006.01)

(52) U.S. Cl.
CPC .......... *H01L 23/3675* (2013.01); *H01L 21/56* (2013.01); *H01L 23/3121* (2013.01)

(58) Field of Classification Search
CPC .. H01L 23/3675; H01L 23/3121; H01L 21/56
See application file for complete search history.

(56) References Cited

U.S. PATENT DOCUMENTS

| | | | |
|---|---|---|---|
| 7,112,882 B2* | 9/2006 | Lee | H01L 24/32 438/33 |
| 7,196,904 B2* | 3/2007 | Ku | H01L 23/4334 257/796 |
| 7,361,986 B2* | 4/2008 | Yuan | H01L 23/4334 257/713 |
| 9,431,316 B2* | 8/2016 | Pagaila | H01L 25/0655 |
| 9,978,660 B2* | 5/2018 | Hung | H01L 23/4334 |
| 10,453,822 B2* | 10/2019 | Kim | H01L 23/552 |
| 2004/0036172 A1* | 2/2004 | Azuma | H01L 23/3128 257/E23.092 |

* cited by examiner

*Primary Examiner* — Dale E Page
*Assistant Examiner* — Abbigale A Boyle
(74) *Attorney, Agent, or Firm* — Akona IP PC

(57) ABSTRACT

Present disclosure relates to IC packages with integrated thermal contacts. In some embodiments, an IC package includes a package substrate, an IC die that is coupled to the package substrate, and at least one thermal contact for coupling to at least a portion of a heat exchanger, where the thermal contact is limited to being in a region located at a periphery of the IC package. In some embodiments, thermal contacts are such that at least a portion of a heat exchanger is to be attached on the side of the IC package. In some embodiments, thermal contacts may be provided within a recessed portion at the periphery of the IC package. Providing a thermal contact at a periphery of an IC package may enable improved cooling options, especially for systems where there is no or limited space for providing conventional heat exchangers on the top of the package.

25 Claims, 13 Drawing Sheets

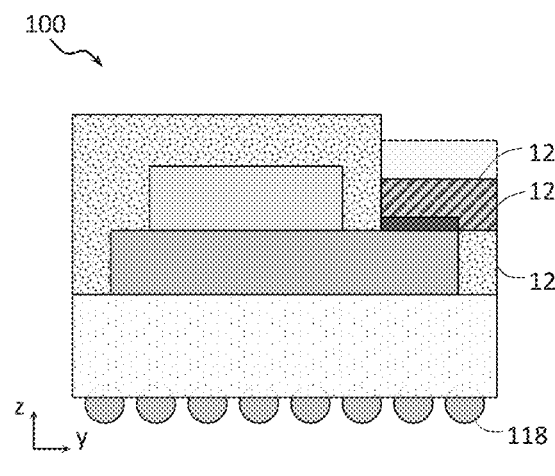
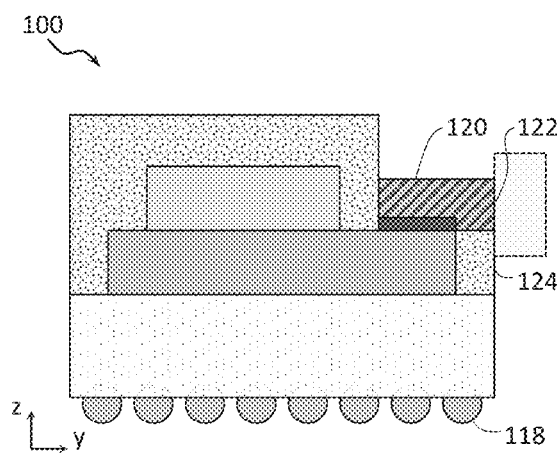
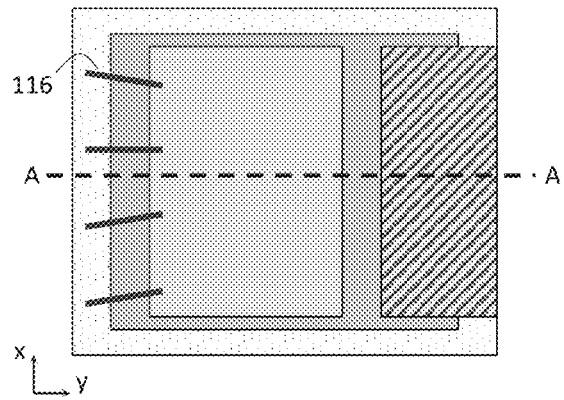
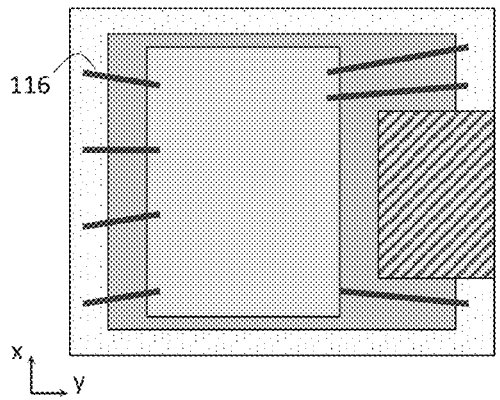
FIG. 1        FIG. 2
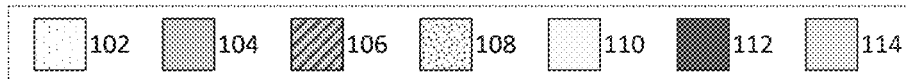

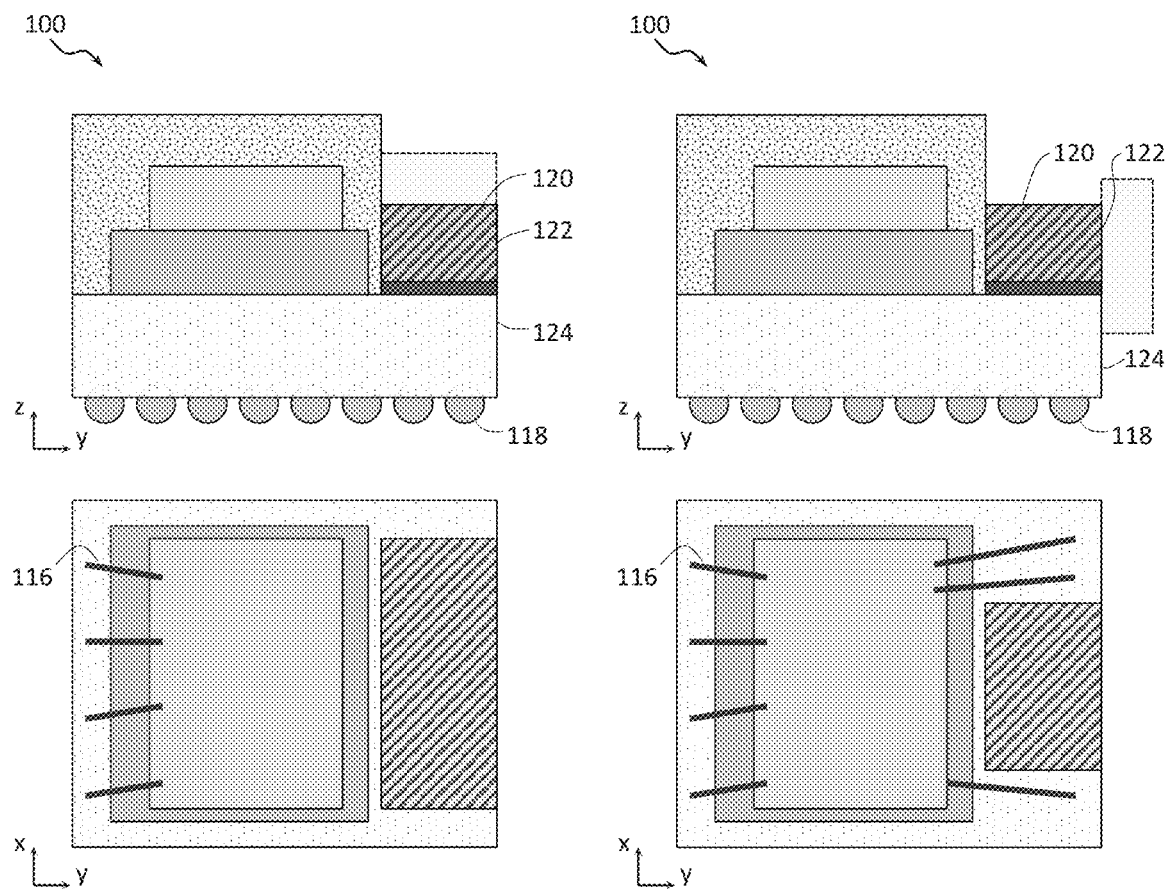
FIG. 3     FIG. 4
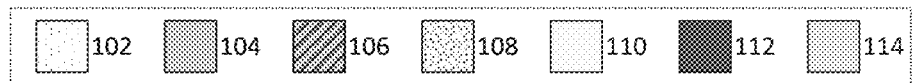

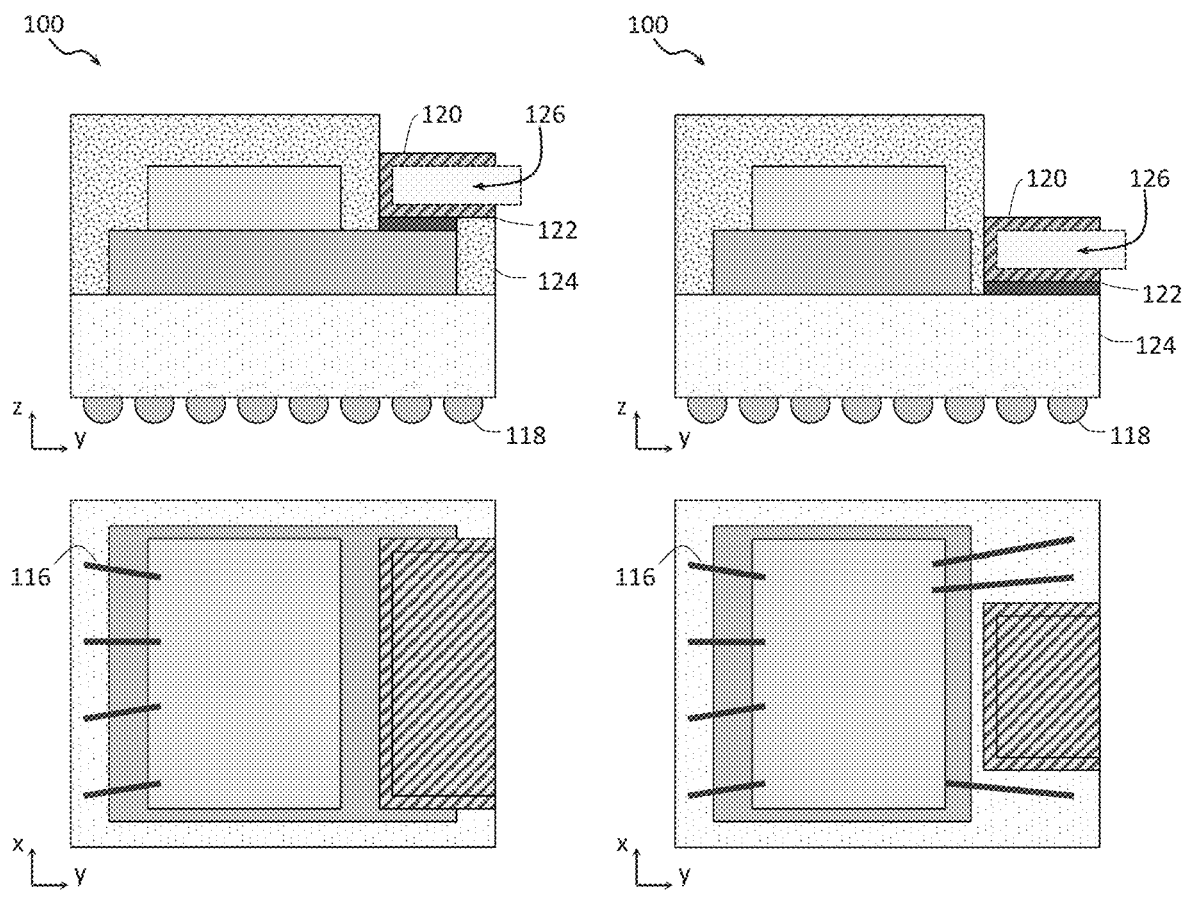

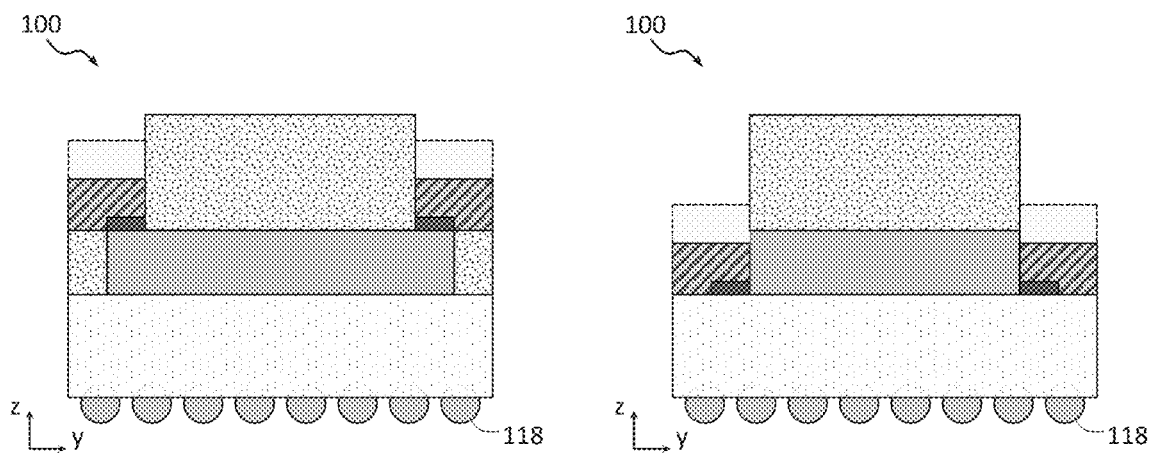
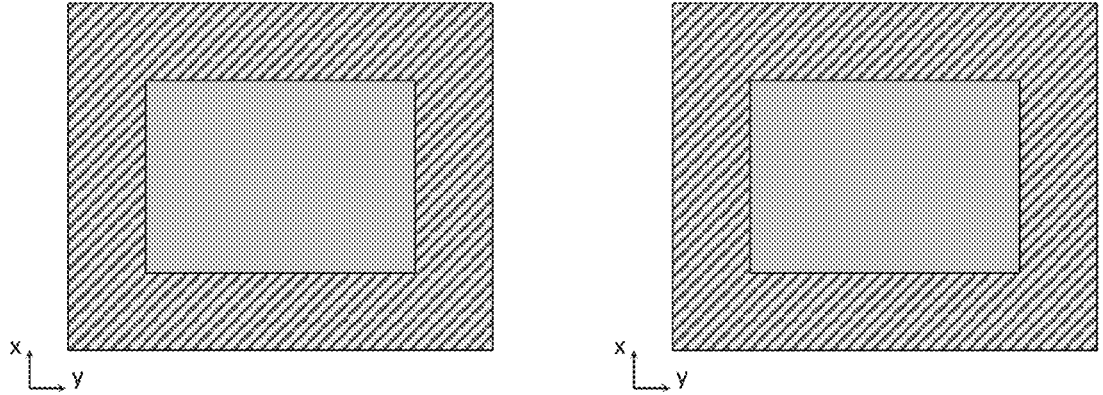
FIG. 7  FIG. 8

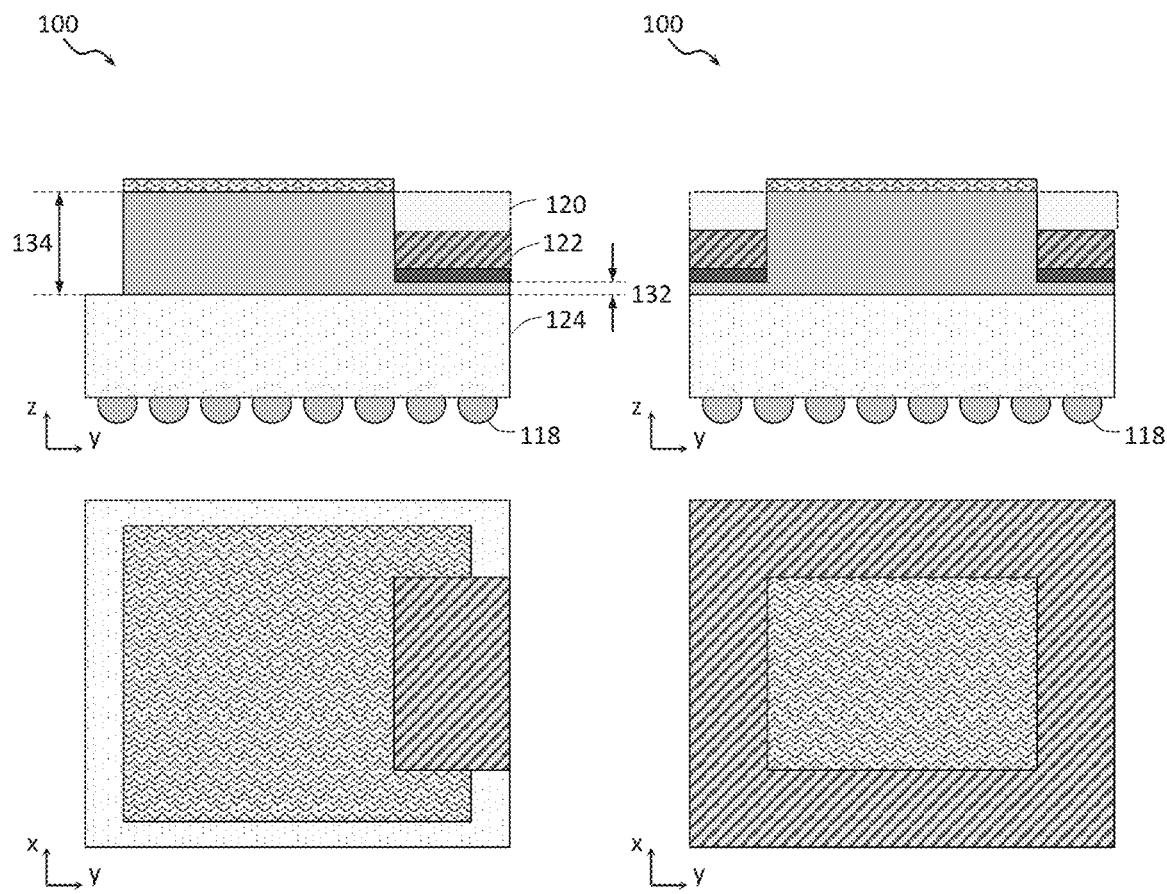
FIG. 9　　　　　　　　　FIG. 10

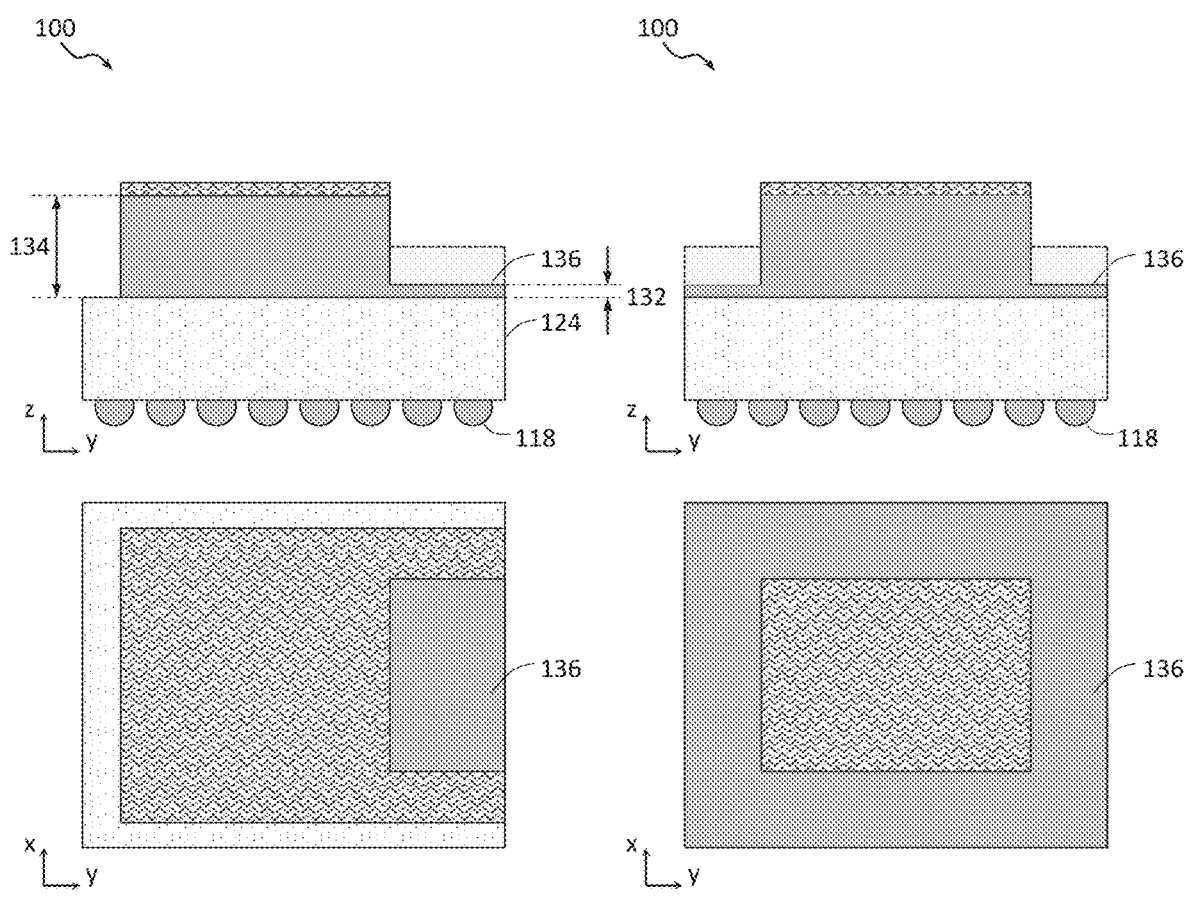
FIG. 11  FIG. 12
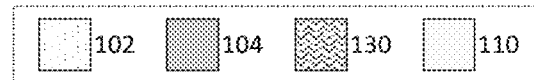

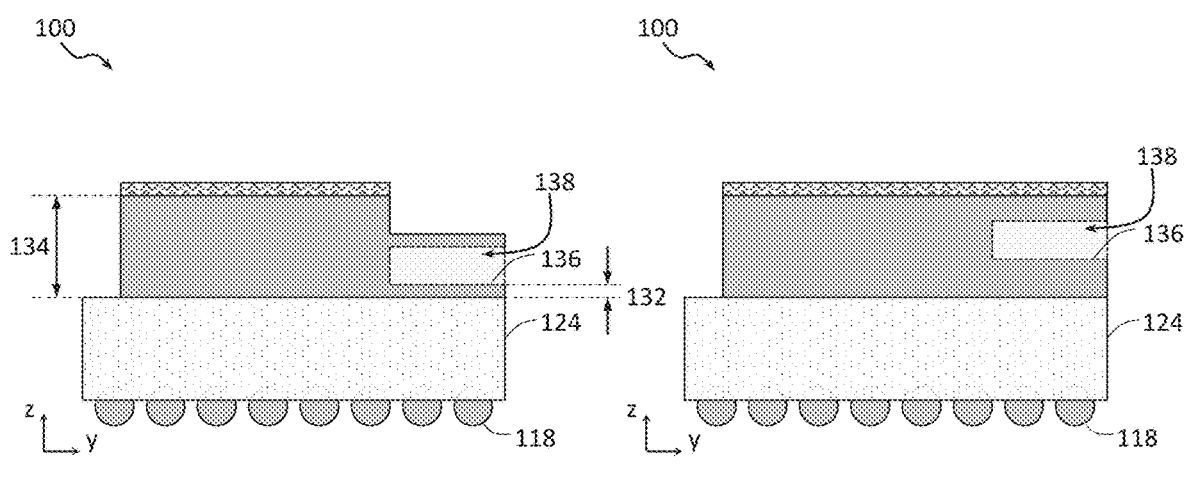
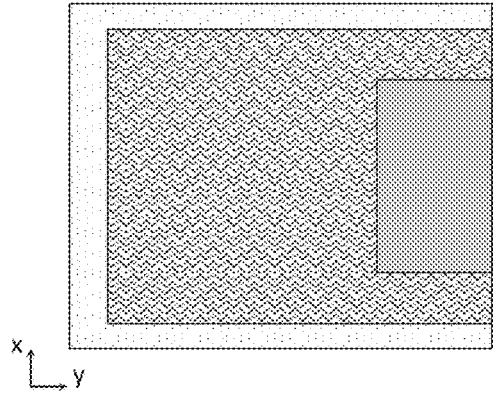
FIG. 13
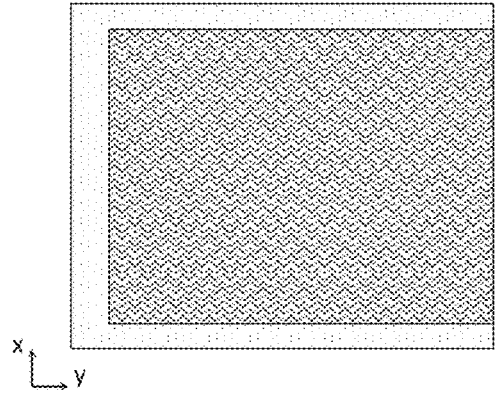
FIG. 14
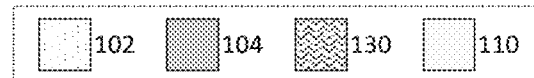

THERMAL CONTACTS AT PERIPHERY OF INTEGRATED CIRCUIT PACKAGES

TECHNICAL FIELD

The present disclosure relates generally to the field of thermal management in integrated circuit (IC) packages.

BACKGROUND

Thermal contacts may be used to move heat away from one or more active electronic components included in an IC package so that the heat can be more readily dissipated by heat exchangers such as heat spreaders, heat pipes, or other thermal management device. Conventionally, thermal contacts are such as to enable attachment of a heat exchanger to the top face of an IC package.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIGS. 1-14 are side cross-sectional and top-down views of example IC packages with thermal contacts in accordance with various embodiments of the present disclosure.

DETAILED DESCRIPTION

Overview

Figure 15:
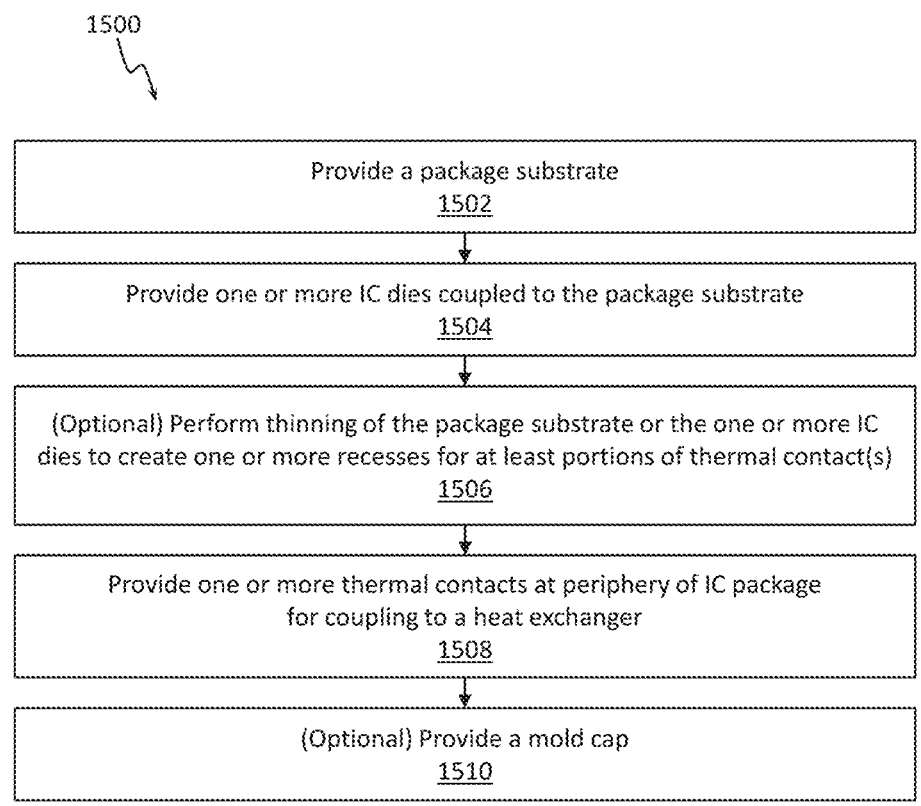
FIG. 15 is a flow diagram of an example method of manufacturing an IC package with one or more thermal contacts according to one embodiment of the present disclosure.

For purposes of illustrating thermal contacts as proposed herein, it is important to understand phenomena that may come into play when typical thermal mitigation measures are applied to an IC package. The following foundational information may be viewed as a basis from which the present disclosure may be properly explained. Such information is offered for purposes of explanation only and, accordingly, should not be construed in any way to limit the broad scope of the present disclosure and its potential applications.

Operation of electronic devices generates heat. Thermal mitigation, also known as thermal management, refers to a range of techniques aiming to keep the operating temperatures of electronic devices within the prescribed thermal budget established for safe device and component operation. One common thermal mitigation technique involves using thermal contacts to move heat away from one or more active electronic components included in an IC package so that the heat can be more readily dissipated by a heat exchanger. Such thermal contacts are typically included within an IC package, while heat exchangers are often external in that they may be provided separately from the IC package, allowing customers to select heat exchangers based on their particular needs.

As mentioned above, conventionally, thermal contacts have been implemented as to enable attachment of a heat exchanger to the top face of an IC package. However, such an approach requires free space above the package, e.g., 0.6 millimeter (mm) may be desired to attach a heat exchanger in the form of a flat heat pipe. Furthermore, as IC packages grow and become more powerful, larger and thicker heat exchangers with more complex geometries may be desired. Recent systems, e.g., recent mobile systems with folded printed circuit boards (PCBs) may not provide sufficient space on top of an IC package or accommodate heat exchangers with more complex geometries. Further, inside some device assemblies/modules, attachment of a heat exchanger to the top of an IC package may not be desirable or even possible due to the pressure such an attachment may cause. For example, during soldering of an IC package module, package balls implementing interconnects may become viscous again and, upon pressure, may dissolve to the sides, shorting each other. Also, for certain package types (e.g., for wirebond packages), a package internal heat path to the top face of the package may be hindered (e.g., by presence of a thick mold cap), and/or there may be no or limited space for a heat exchanger at the top.

Disclosed herein are embodiments of IC packages with integrated thermal contacts, and related devices and methods. In some embodiments, an IC package may include a package substrate, an IC die (or a plurality of IC dies, possibly stacked upon one another) coupled to the package substrate, and at least one thermal contact for coupling to at least a portion of a heat exchanger, where the thermal contact is limited to being in located in a region located at a periphery (i.e., at the outer limits or edge) of the IC package. In some embodiments, thermal contacts as described herein are such that a heat exchanger is to be attached to them on the side of the IC package. In some embodiments, thermal contacts as described herein may be provided within a recessed portion at the periphery of the IC package, so that, even if a heat exchanger is attached to them on the top of the IC package, the upper surface of the heat exchanger does not substantially extend beyond the upper surface of the IC package. Providing a thermal contact at a periphery of an IC package may enable improved cooling options, especially for systems with z-height restrictions, where there is no or limited space for providing conventional heat exchangers on the top of the package. Various thermal contacts disclosed herein may allow powerful processing packages (e.g., central processing unit packages, e.g., with supporting memory chips) to be adequately cooled. This may reduce cost overall and improve functionality, making new computing device designs (e.g., server designs) possible.

As used herein, a "thermal contact" may refer to a portion of thermally conductive material or element serving as an interface between different components and configured to provide a thermally conductive path from one or more IC dies within an IC package to a heat exchanger. Thermal contacts as disclosed herein enable new heat paths from the packaged die(s) to external thermal mitigation measures (heat spreader, heat pipe, etc.) for improved cooling of the die(s). As used herein, a "z-height" refers to a height that is typically measured along the z-axis of an example x-y-z coordinate system where x-y plane is a plane of an IC die/package substrate, and z-axis is perpendicular to the IC die/package substrate.

Various thermal contacts as described herein may be implemented in one or more components associated with an IC device or an IC package, and/or between various such components or packages, where the thermal contacts described herein may provide improved cooling of different dies or other elements. In various embodiments, components associated with an IC include, for example, transistors, diodes, power sources, resistors, capacitors, inductors, sensors, transceivers, receivers, antennas, etc. Components associated with an IC may include those that are mounted on an IC, provided as an integral part of an IC, or those connected to an IC. The IC may be either analog or digital and may be used in a number of applications, such as microprocessors, optoelectronics, logic blocks, audio amplifiers, etc., depending on the components associated with the IC. The IC may be employed as part of a chipset for executing one or more related functions in a computer.

Various ones of the embodiments disclosed herein may provide improved thermal management for complex computing device designs, such as those involving multiple IC packages of different heights and footprints distributed on a circuit board. Such complex computing device designs may arise in large computing server applications, "patch/package-on-interposer" configurations, and "package-on-package" configurations, among others. Additionally, various ones of the embodiments disclosed herein may be beneficially applied in computing tablets in which it may be advantageous to dissipate heat from computing components in the tablet both in the direction normal to the plane of the tablet and within the plane of the tablet. Various ones of the embodiments disclosed herein may include innovative material combinations, manufacturing techniques, and geometrical features.

For purposes of explanation, specific numbers, materials and configurations are set forth in order to provide a thorough understanding of the illustrative implementations. However, it will be apparent to one skilled in the art that the present disclosure may be practiced without the specific details and/or that the present disclosure may be practiced with only some of the described aspects. In other instances, well known features are omitted or simplified in order not to obscure the illustrative implementations.

In the following detailed description, reference is made to the accompanying drawings that form a part hereof, and in which are shown, by way of illustration, embodiments that may be practiced. For convenience, the phrase "FIG. 16" may be used to refer to the collection of drawings of FIGS. 16A-16B. The accompanying drawings are not necessarily drawn to scale. For example, to clarify various layers, structures, and regions, the thickness of some layers may be enlarged. Furthermore, while drawings illustrating various structures/assemblies of example devices may be drawn with precise right angles and straight lines, real world process limitations may prevent implementations of devices exactly as shown. Therefore, it is understood that such drawings revised to reflect example real world process limitations, in that the features may not have precise right angles and straight lines, are within the scope of the present disclosure. Drawings revised in this manner may be more representative of real world structure/assemblies as may be seen on images using various characterization tools, such as e.g., scanning electron microscopy (SEM) or transmission electron microscopy (TEM). In addition, the various structures/assemblies of the present drawings may further include possible processing defects, such as e.g., the rounding of corners, the drooping of the layers/lines, unintentional gaps and/or discontinuities, unintentionally uneven surfaces and volumes, etc., although these possible processing defects may not be specifically shown in the drawings. It is to be understood that other embodiments may be utilized and structural or logical changes to the drawings and descriptions may be made without departing from the scope of the present disclosure. Therefore, the following detailed description is not to be taken in a limiting sense.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). The term "between," when used with reference to measurement ranges, is inclusive of the ends of the measurement ranges. The meaning of "a," "an," and "the" include plural references. The meaning of "in" includes "in" and "on."

The description uses the phrases "in an embodiment" or "in embodiments," which may each refer to one or more of the same or different embodiments. Furthermore, the terms "comprising," "including," "having," and the like, as used with respect to embodiments of the present disclosure, are synonymous. The disclosure may use perspective-based descriptions such as "above," "below," "top," "bottom," and "side"; such descriptions are used to facilitate the discussion and are not intended to restrict the application of disclosed embodiments. Furthermore, stating in the present disclosure that any part (e.g., a layer, film, area, or plate) is in any way positioned on or over (e.g., positioned on/over, provided on/over, located on/over, disposed on/over, formed on/over, etc.) another part means that the referenced part is either in contact with the other part, or that the referenced part is above the other part with one or more intermediate part(s) located therebetween. On the other hand, stating that any part is in contact with another part means that there is no intermediate part between the two parts.

The terms "substantially," "close," "approximately," "near," and "about," generally refer to being within +/−20% of a target value. Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, various aspects of the illustrative implementations will be described using terms commonly employed by those skilled in the art to convey the substance of their work to others skilled in the art. For example, terms "oxide," "carbide," "nitride," etc.

may refer to compounds containing, respectively, oxygen, carbon, nitrogen, etc. In another example, the term "connected" means a direct electrical or magnetic connection between the things that are connected, without any intermediary devices, while the term "coupled" means either a direct electrical or magnetic connection between the things that are connected or an indirect connection through one or more passive or active intermediary devices. The term "circuit" means one or more passive and/or active components that are arranged to cooperate with one another to provide a desired function. Furthermore, unless specified otherwise, as used herein, the term "thermally conductive material" may refer to a single thermally conductive material or a combination of various thermally conductive materials, e.g., different thermally conductive materials that may be mixed or stacked over one another.

IC Packages with Thermal Contacts at a Periphery

FIGS. 1-14 provide cross-sectional side and top-down views of example IC packages with thermal contacts in accordance with various embodiments of the present disclosure. In particular, the upper illustration of each of FIGS. 1-14 provides a cross-sectional side view of a cross section of an IC package along an y-z plane of the example coordinate system shown in these FIGS., while the lower illustration of each of FIGS. 1-14 provides a top-down view of an y-x plane of an IC package. Not all details of the top-down views are shown in the cross section views, and vice versa. For example, the top-down views of FIGS. 1-8 are shown without showing the mold cap and the top-down views of FIGS. 1-14 are shown without showing the heat exchanger 110 in order to not obscure details of the thermal contacts and dies in such top-down views. In another example, the cross section views of FIGS. 1-6 are shown without showing the wirebonds 116 illustrated in the top-down views of these FIGS. The cross-sectional side view of each of FIGS. 1-14 is an example of a view obtained when a cross section is taken along a plane perpendicular to the plane of the drawings and including a line shown as a horizontal dashed line AA in the top-down view of FIG. 1 (the AA line is not shown for other FIGS. in order to not clutter the drawings). In FIGS. 1-14, same reference numerals are used to indicate functionally analogous elements, although, as explained below, their configuration may be different according to different embodiments shown in these FIGS. Different patterns are used in FIGS. 1-14 to illustrate different elements, with a legend provided at the bottom of each page of these FIGS. illustrating correspondence between the patterns and the reference numerals of different elements.

Turning to FIG. 1, an IC package 100 may include a package substrate 102, a first IC die 104, a thermal contact 106, and a mold cap (or simply "mold") 108. FIG. 1 further illustrates a heat exchanger (or a part thereof) 110, in order to show the arrangement of a heat exchanger with respect to the IC package and, in particular, with respect to the thermal contact 106, when the heat exchanger is thermally coupled to the IC package 100.

In some embodiments, the thermal contact 106 may include a metal material, such as e.g., copper, including various copper alloys. In other embodiments, the metal material may be a zinc alloy or an aluminum alloy. Zinc alloys and aluminum alloys may advantageously have relatively low melting temperatures (under 700 degrees Celsius), enabling them to be cast into complex geometrical arrangements without requiring expensive and difficult high casting techniques, as would be conventionally required by metals having high melting temperatures (such as copper). Zinc alloys and aluminum alloys may also be advantageously inexpensive relative to conventional copper. In other embodiments, the thermal contact 106 may include a thermal interface material (TIM), e.g., a TIM paste, or a thermally conductive epoxy (which may be a fluid when applied and may harden upon curing, as known in the art). In still other embodiments, the thermal contact 106 may include stainless steel, silver, gold materials, including various alloys. In various embodiments, the thermal contact 106 may have a thermal conductivity of at least about 50 W/m/K, e.g., at least about 200 W/m/K, or at least about 300 W/m/K. The selection of an appropriate material for the thermal contact 106 may depend on the selection of the materials for other components included in the IC package 100; for improved heat transfer, it may be desirable for the thermal contact 106 to have a thermal conductivity that is higher than a thermal conductivity of other components included in the IC package 100.

In some embodiments, the heat exchanger 110 may include any suitable thermal mitigation element, such as e.g., one or more of heat spreaders, heat pipes, or other thermal management devices. In some embodiments, the heat exchanger 110 may not be part of the IC package 100 in that it may be provided externally (as indicated in FIG. 1 with the heat exchanger 110 being shown with a dashed contour). In other embodiments, the heat exchanger 110 may be integrated within the IC package 100.

Figure 18:
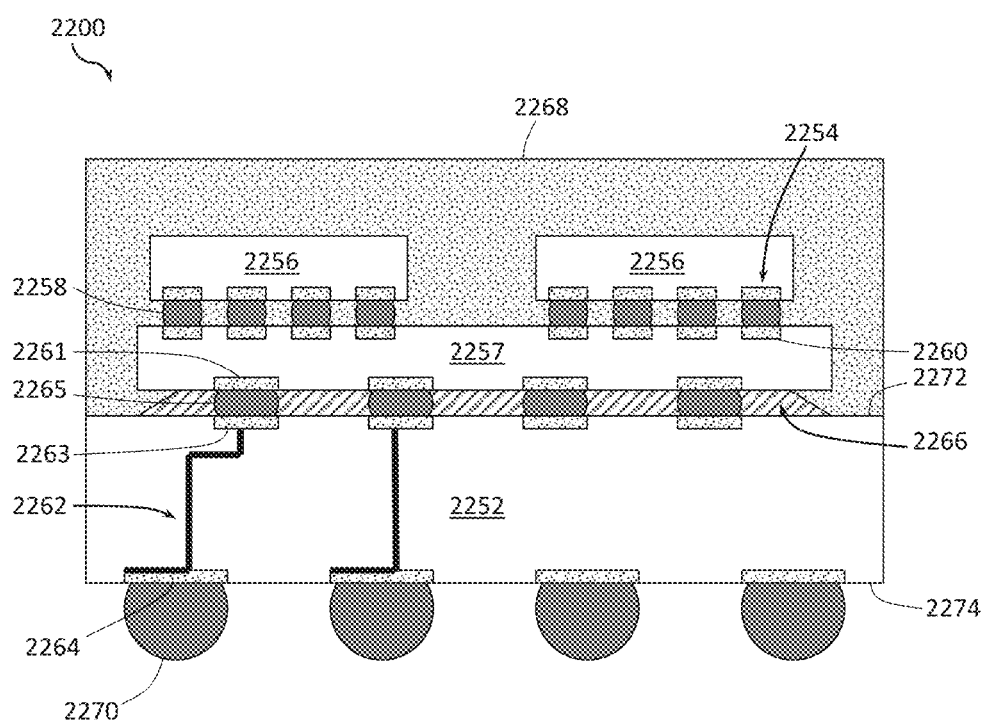
FIG. 18 is a cross-sectional side view of an IC package that may include one or more thermal contacts in accordance with any of the embodiments disclosed herein.

As further shown in FIG. 1, in some embodiments, the IC package 100 may, optionally, further include an attach layer 112, and, in some embodiments, the IC package 100 may, optionally, further include a second IC die 114, e.g., stacked over the first IC die 104, as shown in FIG. 1, where, in some embodiments, the second IC die 114 may be electrically coupled to the package substrate 102 using wirebonds 116. In addition, FIG. 1 further illustrates interconnects 118 on the bottom side of the package substrate 102, for coupling the IC package 100 to another component, such as a circuit board (e.g., a motherboard), an interposer, or another IC package. What is not specifically shown in FIG. 1 in order to not clutter the drawing are various other elements related to electrical connectivity between different elements, such as e.g., interconnects between the first IC die 104 and the package substrate 102, electrically conductive contacts on the package substrate 102 or the IC die 104, or various electrically conductive paths within the package substrate 102 or the IC die 104. Such elements are not shown in FIG. 1 in order to focus the illustration of FIG. 1 on elements related to thermal conductivity, in particular on the thermal contacts 106. Discussions related to electrical connectivity of various elements shown in FIG. 1 are provided below with reference to FIG. 18 providing an illustration of an IC package 2200, which may be analogous to, or an example of, the IC package 100. For example, the package substrate 102 may be implemented as the package substrate 2252, the first IC die 104 may be implemented as one of the dies 2256, the second IC die 114 may also be implemented as one of the dies 2256, the mold cap 108 may be implemented as the mold compound 2268, the interconnects 118 may be implemented as the interconnects 2270, etc. Thus, detailed descriptions provided with respect to various elements of the IC package 2200 shown in FIG. 18 are applicable to the analogous elements shown in FIG. 1, and, in the interests of brevity, are not repeated for FIG. 1.

FIG. 1 illustrates an embodiment where the thermal contact 106 may be thermally coupled to the IC die 104, and where the thermal contact 106 may be configured to couple to the heat exchanger 110 on the top surface 120 of the thermal contact 106. In such an embodiment, as shown in FIG. 1, the thermal contacts 106 may be provided in a recess in the mold cap 108, so that even when the heat exchanger 110 is attached to the thermal contact 106, the z-height of the portion of the IC package 100 with the heat exchanger 110 would not extend beyond that of the mold cap 108. Although not specifically shown in FIG. 1, in some embodiments, the thermal contact 106 may be such that the heat exchanger 110 may also be coupled to the thermal contact 106 on the side surface 122 of the thermal contact 106.

FIG. 1 further illustrates that the thermal contact 106 may be provided at the periphery of the IC package 100, e.g., at the edge 124 of the IC package 100. In some embodiments, the side 122 of the thermal contact 106 may be substantially aligned with the edge 124 of the IC package 100, as shown in FIG. 1. In other embodiments (not shown in FIG. 1), such alignment may be absent, e.g., the side 122 of the thermal contact 106 may be recessed with respect to the edge 124 or may protrude with respect to the edge 124. FIG. 1 further illustrates that the thermal contact 106 may be relatively large in the x-direction, e.g., may extend substantially along most of the length of the first die 104 in the x-direction. Such an embodiment may be advantageous in terms of providing larger surface for thermal coupling between the IC die 104 and the heat exchanger 110. In other embodiments, the thermal contact 106 may be smaller. Furthermore, although the thermal contact 106 illustrated in FIG. 1 has a rectangular cross section, this need not be the case, and the thermal contact 106 may have any desired cross section or footprint. In some embodiments, the shape of the thermal contact 106 may be selected to achieve a desired thermal distribution or to follow mechanical and/or geometrical constraints. For example, the thermal contact 106 may have a trapezoidal cross section, with the shorter parallel side of the trapezoid positioned closer to the IC die 104 and the longer parallel side of the trapezoid positioned closer to the outer top surface 120. In such an embodiment, heat absorbed by the area of the thermal contact 106 corresponding to the shorter parallel side of the trapezoid may be transmitted through the thermal contact 106 and distributed over the larger area of the thermal contact 106 corresponding to the larger parallel side of the trapezoid. The shape of the thermal contact 106 may also be selected based on the material properties of the thermal contact 106. Still further, in some embodiments, the shape of the thermal contact 106 may be selected to be suitable for coupling to at least a portion of a particular heat exchanger 110.

The attach layer 112 shown in FIG. 1 may be used to attach the thermal contact 106 to the IC die 104. In some embodiments, the attach layer 112 may cover at least a part of or extend over the contact surface between thermal contact 106 and the IC die 104. In various embodiments, the attach layer 112 may include any suitable structure, compound, or a combination of compounds, such as thermally conductive glue, adhesive tape, TIMs, solder, etc. In various embodiments, the attach layer 112 or other means for thermally coupling the thermal contact 106 to the IC die 104 may be smaller or larger than the x-y area of the thermal contact 106.

FIGS. 2-10 illustrate other embodiments of the IC package 100. Unless stated otherwise, descriptions provided above with reference to FIG. 1 are applicable to FIGS. 2-10. In other words, FIGS. 2-10 are described in terms of their differences from FIG. 1.

FIG. 2 illustrates an embodiment of the IC package 100 where, similar to FIG. 1, the thermal contact 106 is thermally coupled to the IC die 104, but, instead of the thermal contact 106 being configured to couple to the heat exchanger 110 on the top surface 120 of the thermal contact 106, the thermal contact 106 shown in FIG. 2 is configured to couple to the heat exchanger 110 on the side surface 122. In such an embodiment, the fact that the thermal contact 106 is provided at the periphery of the IC package 100 may be particularly advantageous, as this is what may enable attachment of the heat exchanger 110 to the side surface 122 of the thermal contact 106. Coupling the heat exchanger 110 to the side surface 122 of the thermal contact 106 may also help with keeping the z-height of the portion of the IC package 100 with the heat exchanger 110 relatively low, e.g., below that of the mold cap 108.

Although not specifically shown in FIG. 2, in some further embodiments of the IC package as shown in FIG. 2, the thermal contact 106 may also be covered by mold, e.g., the mold cap 108 may extend over the thermal contact 106.

FIG. 3 illustrates an embodiment of the IC package 100 where, similar to FIG. 1, the thermal contact 106 is configured to couple to the heat exchanger 110 on the top surface 120 of the thermal contact 106, but, instead of the thermal contact 106 being coupled to the IC die 104, the thermal contact 106 shown in FIG. 3 is coupled to the package substrate 102. Such an embodiment may further assist keeping the z-height of the portion of the IC package 100 with the heat exchanger 110 relatively low, e.g., below that of the IC dies, and/or below that of the mold cap 108.

In some embodiments of FIG. 3, the thermal contacts 106 may be provided in a recess in the mold cap 108. Furthermore, although not specifically shown in FIG. 2, in some embodiments, the thermal contact 106 may be such that the heat exchanger 110 may also be coupled to the thermal contact 106 on the side surface 122 of the thermal contact 106.

Descriptions with respect to the location and shape of the thermal contact 106 provided for FIG. 1 are applicable to FIG. 3, with the modification that now the thermal contact 106 is coupled to the package substrate 102 instead of the IC die 104. Similarly, descriptions with respect to the attach layer 112 provided for FIG. 1 are applicable to FIG. 3, with the modification that now the attach layer 112 would be configured to attach the thermal contact 106 to the package substrate 102 instead of the IC die 104.

FIG. 4 illustrates an embodiment of the IC package 100 where, similar to FIG. 2, the thermal contact 106 is configured to couple to the heat exchanger 110 on the side surface 122 of the thermal contact 106, but, instead of the thermal contact 106 being coupled to the IC die 104, the thermal contact 106 shown in FIG. 4 is coupled to the package substrate 102, similar to FIG. 3. Similar to the embodiments of FIGS. 2 and 3, such an embodiment may further assist keeping the z-height of the portion of the IC package 100 with the heat exchanger 110 relatively low, e.g., below that of the mold cap 108.

Similar to FIG. 3, in some embodiments of FIG. 4, the thermal contacts 106 may be provided in a recess in the mold cap 108.

Descriptions with respect to the location and shape of the thermal contact 106 provided for FIG. 1 are applicable to FIG. 4, with the modification that now the thermal contact 106 is coupled to the package substrate 102 instead of the IC die 104. Similarly, descriptions with respect to the attach layer 112 provided for FIG. 1 are applicable to FIG. 4, with the modification that now the attach layer 112 would be configured to attach the thermal contact 106 to the package substrate 102 instead of the IC die 104.

Similar to FIG. 2, although not specifically shown in FIG. 4, in some further embodiments of the IC package as shown in FIG. 4, the thermal contact 106 may also be covered by mold, e.g., the mold cap 108 may extend over the thermal contact 106.

FIG. 5 illustrates an embodiment of the IC package 100 where, similar to FIGS. 1-2, the thermal contact 106 is coupled to the IC die 104, but, instead of the thermal contact 106 being configured to couple to the heat exchanger 110 on the top surface 120 or on the side surface 122 of the thermal contact 106, the thermal contact 106 shown in FIG. 5 includes an opening 126 into which the heat exchanger 110 may be inserted in order to be coupled to the thermal contact 106. Shape and size of the opening 126 may be such as to be able to receive and form thermal coupling with the heat exchanger 110. The embodiment shown in FIG. 5 may be advantageous in terms of providing particularly stable way to couple the thermal contact 106 and the heat exchanger 110, since the opening 126 may prevent or minimize movement of the heat exchanger 110 with respect to the thermal contact 106. Such an embodiment may further assist keeping the z-height of the portion of the IC package 100 with the heat exchanger 110 relatively low, e.g., below that of the mold cap 108.

In some embodiments of FIG. 5, the thermal contacts 106 may be provided in a recess in the mold cap 108. Furthermore, although not specifically shown in FIG. 5, in some embodiments, the thermal contact 106 may be such that the heat exchanger 110 may also be coupled to the thermal contact 106 on the top surface 120 and/or on the side surface 122 of the thermal contact 106.

Descriptions with respect to the location and the x-y plane shape of the thermal contact 106 provided for FIGS. 1-2 are applicable to FIG. 5, with the modification that now the thermal contact 106 also includes an opening 126.

Similar to FIGS. 2 and 4, although not specifically shown in FIG. 5, in some further embodiments of the IC package as shown in FIG. 5, the thermal contact 106 may also be covered by mold, e.g., the mold cap 108 may extend over the thermal contact 106.

FIG. 6 illustrates an embodiment of the IC package 100 where, similar to FIGS. 3-4, the thermal contact 106 is coupled to the package substrate 102, but, instead of the thermal contact 106 being configured to couple to the heat exchanger 110 on the top surface 120 or on the side surface 122 of the thermal contact 106, the thermal contact 106 shown in FIG. 6 includes an opening 126 into which the heat exchanger 110 may be inserted in order to be coupled to the thermal contact 106. Discussions provided with respect to the opening 126 shown in FIG. 5 are applicable to FIG. 6 and, in the interests of brevity, not repeated.

In some embodiments of FIG. 6, the thermal contacts 106 may be provided in a recess in the mold cap 108. Furthermore, although not specifically shown in FIG. 6, in some embodiments, the thermal contact 106 may be such that the heat exchanger 110 may also be coupled to the thermal contact 106 on the top surface 120 and/or on the side surface 122 of the thermal contact 106.

Descriptions with respect to the location and the x-y plane shape of the thermal contact 106 provided for FIGS. 3-4 are applicable to FIG. 6, with the modification that now the thermal contact 106 also includes an opening 126.

Similar to FIGS. 2, 4, and 5, although not specifically shown in FIG. 6, in some further embodiments of the IC package as shown in FIG. 6, the thermal contact 106 may also be covered by mold, e.g., the mold cap 108 may extend over the thermal contact 106.

FIG. 7 illustrates an embodiment of the IC package 100 where, similar to FIGS. 1-2, the thermal contact 106 is coupled to the IC die 104, but, instead of the thermal contact 106 being provided at one side of the IC die 104, the thermal contact 106 shown in FIG. 7 is formed as a closed-contour frame enclosing all sides of the IC die 104. In such an implementation, shape and size of the thermal contact 106 may be such as to be able to receive and form thermal coupling with the heat exchanger 110, but it does not have to be completely conformal to the shape and size of the heat exchanger 110. For example, the thermal contact 106 provided as a frame as shown in FIG. 7 may advantageously allow attachment of multiple heat exchangers 110 thereto, where the multiple heat exchangers 110 may be heat exchangers of different types. The embodiment shown in FIG. 7 may also be advantageous in terms of flexibility provided in the location where a heat exchanger 110 is to be attached; in general, a heat exchanger 110 may be attached to any point along the frame of the thermal contact 106 as shown in FIG. 7, and the specific location of the heat exchanger 110 may be selected in view of where heat dissipation is desired.

Similar to FIGS. 1-2, in some embodiments of FIG. 7, the thermal contacts 106 may be provided in a recess in the mold cap 108. Furthermore, although not specifically shown in FIG. 7, in some embodiments, the frame of the thermal contact 106 may be such that the heat exchanger 110 may be coupled to the thermal contact 106 both on the top surface 120 and on the side surface 122 of the thermal contact 106. Still further, although also not specifically shown in FIG. 7, in some embodiments, the frame of the thermal contact 106 may be such that the heat exchanger 110 may be coupled to the thermal contact 106 only on the side surface 122, instead of the top surface 120, of the thermal contact 106. In addition, also not specifically shown in FIG. 7, but, in some embodiments, the frame of the thermal contact 106 may be a partial contour, instead of a complete closed-contour enclosing all sides of the IC die 104.

FIG. 8 illustrates an embodiment of the IC package 100 where, similar to FIGS. 3-4, the thermal contact 106 is coupled to the package substrate 102, but, instead of the thermal contact 106 being provided at one side of the IC die 104, the thermal contact 106 shown in FIG. 7 is formed as a closed-contour frame enclosing all sides of the IC die 104. Discussions provided with respect to the frame of the thermal contact 106 shown in FIG. 7 and applicable to FIG. 8 and, in the interests of brevity, not repeated.

While all of the embodiments shown in FIGS. 1-8 illustrate embodiments where the mold cap 108 is used, in other embodiments, the IC package 100 may be a bare die package, i.e., the mold cap 108 may be absent. In such embodiments, the thermal contact 106 may still be provided so that the z-height of the portion of the IC package 100 with the heat exchanger 110 would not extend beyond that of the rest of the IC package 100. Two examples of such embodiments are shown in FIGS. 9-10.

FIG. 9 illustrates an embodiment of the IC package 100 where, similar to FIGS. 1, 2, and 5, the thermal contact 106 is thermally coupled to the IC die 104, but the IC die 104 shown in FIG. 9 is not enclosed by the mold cap 108. Instead, as shown in FIG. 9, the IC die 104 may have a backside protection layer 130 to protect the circuits of the IC die 104. In some embodiments, the backside protection layer 130 may include one or more of backside protection tapes, absorber tapes, adhesives, mold films, resins, foils, etc., and may have a thickness between about 1 and 100 micrometers, including all values and ranges therein, e.g., between about 5 and 40 micrometers. FIG. 9 also illustrates absence of the optional second IC die 114.

Now that there is no mold cap 108 adding to the z-height of the IC package 100, the z-height of the IC package with the heat exchanger 110 may be minimized by providing the thermal contact 106 and, later, the heat exchanger 110, in an area where the IC die 104 is thinned. In some embodiments, a thickness 132 of the IC die 104 in the area where the thermal contact 106 is provided may be between about 5 and 90 percent (%) of the total thickness 134 of the IC die 104, including all values and ranges therein, e.g., between about 20 and 60%, or between about 30 and 50%. Thus, embodiment of FIG. 9 may be seen as the thermal contact 106 being provided in a recess in the IC die 104.

Although not specifically shown in FIG. 9, in some embodiments, the thermal contact 106 may be such that the heat exchanger 110 may also be coupled to the thermal contact 106 on the side surface 122 of the thermal contact 106, as described with reference to FIG. 2. Furthermore, although not specifically shown in FIG. 9, in some embodiments, the thermal contact 106 may be a thermal contact with the opening 126 as described with reference to FIG. 5.

Descriptions with respect to the location and shape of the thermal contact 106 provided for FIGS. 1, 2, and 5 are applicable to FIG. 9, with the modification that now the thermal contact 106 is coupled to the thinned portion of the IC die 104. Similarly, descriptions with respect to the attach layer 112 provided for FIGS. 1, 2, and 5 are also applicable to FIG. 9, with the modification that now the attach layer 112 would be configured to attach the thermal contact 106 to the thinned portion of the IC die 104.

Although not specifically shown in FIG. 9, in some embodiments, the thermal contact 106 may be a thermal contact with the opening 126 as described with reference to FIG. 5, instead of what is shown in FIG. 9.

FIG. 10 illustrates an embodiment of the IC package 100 where, similar to FIG. 9, the thermal contact 106 is thermally coupled to the IC die 104 and the IC die 104 is not enclosed by the mold cap 108 but by the backside protection layer 130, but, similar to FIG. 7, the thermal contact 106 shown in FIG. 10 is formed as a closed-contour frame enclosing all sides of the IC die 104. Similar to the embodiment of FIG. 9, now that in FIG. 10 there is no mold cap 108 adding to the z-height of the IC package 100, the z-height of the IC package with the heat exchanger 110 may be minimized by providing the thermal contact 106 and, later, the heat exchanger 110, in an area where the IC die 104 is thinned.

Descriptions with respect to the frame of the thermal contact 106 provided for FIG. 7 are applicable to FIG. 10, and, therefore, in the interests of brevity, are not repeated. Descriptions with respect to the thinning of the IC die 104 provided for FIG. 9 are applicable to FIG. 10, and, therefore, in the interests of brevity, are also not repeated.

In some other embodiments where the IC die is thinned to provide space for the thermal contact 106, e.g., in the embodiments as shown in FIGS. 9 and 10, the thermal contact 106 may be implemented not as a separate contact material, but as, simply, an upper portion of the thinned portion of the semiconductor material of the IC die 104 (such embodiments are not shown in the figures), in which case the attach layer 112 would also not be implemented. Semiconductor materials typically used as the IC die 104 may have sufficiently high thermal conductivity to serve as a thermal contact. Two examples of such embodiments are shown in FIGS. 11 and 12.

FIG. 11 illustrates that, similar to the embodiment of FIG. 9, a thermal contact and, later, the heat exchanger 110, may be provided in an area where the IC die 104 is thinned. In contrast to the embodiment of FIG. 9, in the embodiment of FIG. 11, the thermal contact is just an upper surface of the thinned portion of the IC die 104, providing a thermal contact area 136 for coupling to at least a portion of the heat exchanger 110. Although not specifically shown in FIG. 11, in some embodiments, the thermal contact area 136 may include a thin layer containing a metal, either deposited deliberately, or formed spontaneously on the thinned portion of the IC die 104 (e.g., as a result of metallization of a silicon surface, in case the IC die 104 includes silicon). In some embodiments, a thickness 132 of the IC die 104 in the area where the die is thinned to provide the thermal contact area 136 may be between about 5 and 90 percent (%) of the total thickness 134 of the IC die 104, including all values and ranges therein, e.g., between about 20 and 60%, or between about 30 and 50%. Thus, embodiment of FIG. 11 may be seen as the thermal contact being provided by virtue of forming a recess in the IC die 104.

Descriptions with respect to the location and shape of the thermal contact 106 provided for FIGS. 1, 2, and 5 are applicable to the thermal contact area 136 shown in FIG. 11, with the modification that now the thermal contact is implemented as the thermal contact area 136 in the upper portion of the thinned portion of the IC die 104, and with the modification that the attach layer 112 is not used.

FIG. 12 illustrates an embodiment of the IC package 100 where, similar to FIG. 11, the thermal contact is implemented as the thermal contact area 136 where the IC die 104 is thinned, except that the thermal contact area 136 is implemented as a closed-contour frame enclosing all sides of the IC die 104, similar to the embodiment of FIG. 10. Similar to the embodiment of FIG. 11, the z-height of the IC package with the heat exchanger 110 as shown in FIG. 12 may be minimized by providing the thermal contact area 136 and, later, the heat exchanger 110, in an area where the IC die 104 is thinned.

Descriptions with respect to the frame of the thermal contact 106 provided for FIG. 7 are applicable to the thermal contact area 136 shown in FIG. 12, and, therefore, in the interests of brevity, are not repeated. Descriptions with respect to the thinning of the IC die 104 provided for FIG. 9 are applicable to FIG. 12, and, therefore, in the interests of brevity, are also not repeated.

In still further embodiments, the recognition that the semiconductor material of the IC die 104 may itself serve as a thermal contact for enabling heat exchange between the IC die 104 and the heat exchanger 110 may be applied to different architectures. For example, FIGS. 13 and 14 illustrate that openings 138 may be formed within the IC die 104, similar to the openings 126 shown in FIGS. 5 and 6, except that, instead of providing a designated thermal contact 106 as shown in FIGS. 5 and 6, the openings 138 are formed in the semiconductor material of the IC die 104. As shown in FIG. 13, the IC die 104 may be thinned, but it does not have to be (as shown in FIG. 14).

The opening 138 may be any opening in the IC die 104 into which the heat exchanger 110 may be inserted in order to be coupled to the IC die 104. Shape and size of the opening 138 may be such as to be able to receive and form thermal coupling with the heat exchanger 110. Similar to the embodiments of FIGS. 5 and 6, the embodiments shown in FIGS. 13 and 14 may be advantageous in terms of providing particularly stable way to provide thermal coupling between the IC die 104 and the heat exchanger 110, since the opening 138 may prevent or minimize movement of the heat exchanger 110 with respect to the IC die 104. Such embodiments may further assist keeping the z-height of the portion of the IC package 100 with the heat exchanger 110 relatively low.

Descriptions with respect to the location and the x-y plane shape of the thermal contact 106 provided for FIGS. 1-2 and FIGS. 5-6 are applicable to the opening 138.

While embodiments shown in FIGS. 9-14 illustrate the backside protection layer 130, in other embodiments (not specifically shown in FIGS.), the backside protection layer 130 may be replaced with the mold cap 108, or may be supplemented with the mold cap 108.

Various IC packages with thermal contacts at a periphery of IC packages described herein, e.g., the IP packages 100 described with reference to FIGS. 1-14, do not represent an exhaustive set of arrangements utilizing thermal contacts in a manner that allows reducing the z-height of IC packages when heat exchangers are attached but merely provide examples of such arrangements. Although particular arrangements of materials are discussed with reference to FIGS. 1-14 illustrating example IC packages, in some embodiments, various intermediate materials may be included in the IC packages of these FIGS. Note that FIGS. 1-14 illustrating example IC packages are intended to show relative arrangements of the components therein, and that IC packages of FIGS. 1-14 may include other components that are not illustrated (e.g., various interfacial layers or components related to electrical connectivity). Additionally, although some components of the IC packages are illustrated in FIGS. 1-14 as being planar rectangles or formed of rectangular solids, this is simply for ease of illustration, and embodiments of these IC packages, in particular of the thermal contacts 106, may be curved, rounded, or otherwise irregularly shaped as dictated by, and sometimes inevitable due to, the manufacturing processes used to fabricate various components.

In various embodiments, any of the features discussed with reference to any of FIGS. 1-14 herein may be combined with any other features to form an IC package with one or more thermal contacts that allow reducing the z-height of the IC package when one or more heat exchangers are attached, e.g., to form a modified IC package 100. Some such combinations are described above. In another example of such a combination, a modified IC package 100 may be substantially as the IC package shown in FIG. 1, 5, or 7 (in particular, the IC package 100 may include the mold cap 108), but that the thermal contact may be provided in a recess on the IC die 104 as shown in FIG. 9. In another example, in a modified IC package 100, a portion of the thermal contact 106 may be coupled to the IC die 104 as shown in FIG. 1, while a portion may be coupled to the package substrate 102 as shown in FIG. 3. In a similar example, in a modified IC package 100, a portion of the thermal contact 106 may be coupled to the IC die 104 as shown in FIG. 2, while a portion may be coupled to the package substrate 102 as shown in FIG. 3; or a portion of the thermal contact 106 may be coupled to the IC die 104 as shown in FIG. 1 or 2, while a portion may be coupled to the package substrate 102 as shown in FIG. 4. In yet another example, a plurality of thermal contacts may be provided in an IC package 100, where the different thermal contacts may take on any of the embodiments of the thermal contacts 106 described herein. These particular combinations are simply examples, and, in further embodiments, any combination of features described herein, in particular of features described with referenced to FIGS. 1-14, may be used.

Figure 20:
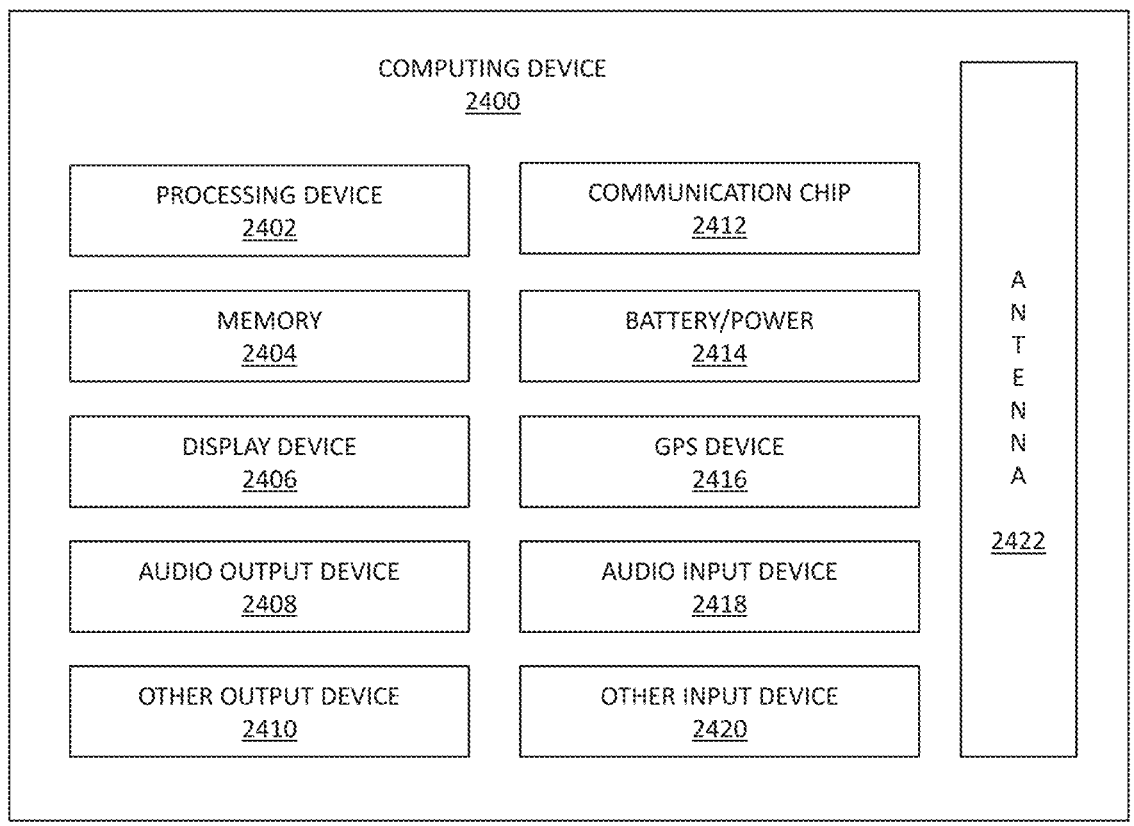
FIG. 20 is a block diagram of an example computing device that may include one or more thermal contacts in accordance with any of the embodiments disclosed herein.

The IC packages 100 with thermal contacts 106 disclosed herein may include circuitry for performing any computing task. For example, an IC package 100 may include processing circuitry (e.g., a server processor, a digital signal processor, a central processing unit, a graphics processing unit, etc.), memory device circuitry, sensor circuitry, wireless or wired communication circuitry, or any other suitable circuitry. FIG. 20 (discussed below) illustrates an example of a computing device 2400 which may include one or more of the IC packages 100 with thermal contacts 106 to thermally manage one or more of its components; any suitable ones of the components of the computing device 2400 may be included in one or more IC packages 100 thermally managed using one or more thermal contacts 106.

Manufacturing IC Packages with Thermal Contacts at a Periphery

Various IC packages with thermal contacts at the periphery as disclosed herein may be manufactured using any suitable techniques. In some implementations, a choice of a technique may depend on whether the thermal contacts as described herein are to be included in a bare die package (e.g., as shown in FIGS. 9-14) or in an IC package with a mold cap (e.g., as shown in FIGS. 1-8). In some implementations, a choice of a technique may depend on whether the thermal contacts as described herein are to be provided on an IC die or on a package substrate. In some implementations, a choice of a technique may depend on whether the thermal contacts as described herein are to be provided on a thinned portion of an IC die or a package substrate, or not.

FIG. 15 is a flow diagram of an example method 1500 of manufacturing an IC package with one or more thermal contacts according to one embodiment of the present disclosure. Although the operations of the method 1500 are illustrated in FIG. 15 once each and in a particular order, the operations may be performed in any suitable order and repeated as desired. For example, one or more operations may be performed in parallel to manufacture multiple thermal contacts, or multiple IC packages with such thermal contacts, substantially simultaneously. In another example, the operations may be performed in a different order to reflect the structure of a particular IC package in which one or more thermal contacts may be included. Furthermore, the method shown in FIG. 15 may further include other manufacturing operations related to fabrication of other components of the IC packages described herein, or any devices that include thermal contacts or IC packages as described herein. For example, the method shown in FIG. 15 may include various cleaning operations, surface planarization operations (e.g., using chemical mechanical polishing), operations for surface roughening, operations to include barrier and/or adhesion layers as desired, and/or operations for incorporating the thermal contacts as described herein in, or with, an IC component, a computing device, or any desired structure or device.

As shown in FIG. 15, the method 1500 may begin with 1502, where a package substrate is provided. The package substrate provided at 1502 may include any package substrate suitable for providing a foundation upon which an IC package according to any of the embodiments described herein may be built. For example, the package substrate may be the package substrate 2252 as shown in FIG. 18.

At 1504, one or more IC dies may be coupled to the package substrate provided at 1502. The one or more IC dies provided at 1504 may include IC dies according to any of the embodiments described herein, e.g., any of the IC dies 104 or 114 described with reference to FIGS. 1-14 or dies 2256 described with reference to FIG. 18. The one or more IC dies may be coupled to the package substrate at 1504 using any suitable coupling elements, e.g., interconnects 2258 or 2265, described with reference to FIG. 18.

At 1506, the one or more IC dies or the package substrate may, optionally, be thinned in order to create one or more recesses for housing at least a portions of one or more thermal contacts as described herein. In various embodiments, thinning of 1506 may be performed by using processes such as one or more of laser ablation, etching, lithography, grinding, etc. In some embodiments, the one or more IC dies or the package substrate may be thinned in this manner prior to being coupled at 1504.

At 1508, one or more thermal contacts for coupling to one or more portions of one or more heat exchangers may be provided at desired locations on the one or more IC dies or the package substrate. The one or more thermal contacts provided at 1508 may include thermal contacts according to any of the embodiments described herein, e.g., any of the thermal contacts 106 described with reference to FIGS. 1-14. The one or more thermal contacts may be coupled to the one or more IC dies or the package substrate at 1508 using any suitable coupling elements, e.g., the attach layer 112, described above.

At 1510, optionally, a mold cap may be provided to encapsulate the IC package. The mold cap provided at 1510 may include the mold cap according to any embodiments described herein, e.g., the mold cap 108 described with reference to FIGS. 1-8 or the mold compound 2268 described with reference to FIG. 18. The mold cap may be provided at 1510 using any suitable technique, as known in the art. In some embodiments, the mold cap may be provided prior to providing the thermal contacts. In some embodiments, the mold cap may cover at least a portion of the thermal contact. In some embodiments, the mold cap may leave at least a portion of the thermal contact uncovered.

Many variations are possible to the method shown in FIG. 15, all of which being within the scope of the present disclosure.

Example Devices And Components

The thermal contacts disclosed herein, e.g., any of the embodiments of the thermal contacts 106, or the IC packages with such thermal contacts, e.g., any of the embodiments of the IC packages 100, may be included in any suitable electronic component. FIGS. 16-16 illustrate various examples of structures that may be used with or include any of the thermal contacts, including any of the IC packages with such thermal contacts, disclosed herein.

Figures 16A, 16B:
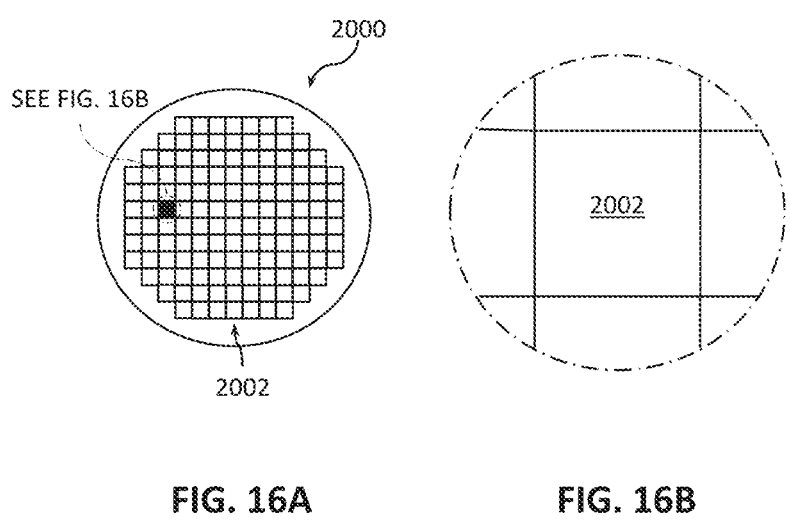
FIGS. 16A-16B are top views of a wafer and dies that may include, or be thermally coupled to, one or more thermal contacts in accordance with any of the embodiments disclosed herein.

FIGS. 16A-16B are top views of a wafer 2000 and dies 2002 that may include, or be thermally coupled to, one or more thermal contacts in accordance with any of the embodiments disclosed herein. In some embodiments, the dies 2002 may be included in an IC package along with one or more of the thermal contacts as discussed above, in accordance with any of the embodiments disclosed herein. For example, any of the dies 2002 may serve as a first die 104 or a second die 114 in an IC package 100. The wafer 2000 may be composed of semiconductor material and may include one or more dies 2002 having IC structures formed on a surface of the wafer 2000. Each of the dies 2002 may be a repeating unit of a semiconductor product that includes any suitable IC (e.g., ICs including one or more thermal contacts as described herein). After the fabrication of the semiconductor product is complete (e.g., after manufacture of thermal contacts as described herein), the wafer 2000 may undergo a singulation process in which each of the dies 2002 is separated from one another to provide discrete "chips" of the semiconductor product. In particular, devices that include one or more thermal contacts as disclosed herein may take the form of the wafer 2000 (e.g., not singulated) or the form of the die 2002 (e.g., singulated). The die 2002 may include one or more transistors (e.g., one or more of the transistors 2140 of FIG. 17, discussed below) and/or supporting circuitry to route electrical signals to the transistors, as well as any other IC components. In some embodiments, the wafer 2000 or the die 2002 may include a memory device (e.g., a static random access memory (SRAM) device), a logic device (e.g., an AND, OR, NAND, or NOR gate), or any other suitable circuit element. Multiple ones of these devices may be combined on a single die 2002. For example, a memory array formed by multiple memory devices may be formed on a same die 2002 as a processing device (e.g., the processing device 2402 of FIG. 20) or other logic that is configured to store information in the memory devices or execute instructions stored in the memory array.

Figure 17:
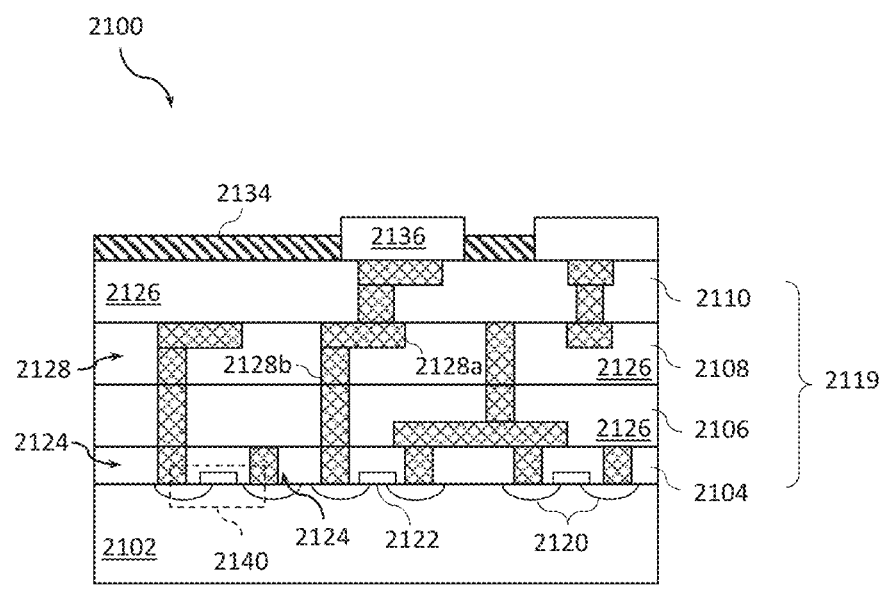
FIG. 17 is a cross-sectional side view of an IC device that may include, or be thermally coupled to, one or more thermal contacts in accordance with any of the embodiments disclosed herein.

FIG. 17 is a cross-sectional side view of an IC device 2100 that may include, or be thermally coupled to, one or more thermal contacts in accordance with any of the embodiments disclosed herein. For example, the IC device 2100 may serve as a first die 104 or a second die 114 in an IC package 100. The IC device 2100 may be formed on a substrate 2102 (e.g., the wafer 2000 of FIG. 16A) and may be included in a die (e.g., the die 2002 of FIG. 16B). The substrate 2102 may include any material that may serve as a foundation for an IC device 2100. The substrate 2102 may be a semiconductor substrate composed of semiconductor material systems including, for example, N-type or P-type materials systems. The substrate 2102 may include, for example, a crystalline substrate formed using a bulk silicon or a silicon-on-insulator (SOI) structure. In some embodiments, the substrate 2102 may be formed using alternative materials, which may or may not be combined with silicon, that include, but are not limited to, germanium, silicon germanium, indium antimonide, lead telluride, indium arsenide, indium phosphide, gallium arsenide, aluminum gallium arsenide, aluminum arsenide, indium aluminum arsenide, aluminum indium antimonide, indium gallium arsenide, gallium nitride, indium gallium nitride, aluminum indium nitride or gallium antimonide, or other combinations of group III-N or group IV materials. In some embodiments, the substrate 2102 may be non-crystalline. In some embodiments, the substrate 2102 may be a PCB substrate. Although a few examples of the substrate 2102 are described here, any material or structure that may serve as a foundation upon which an IC device 2100 may be built falls within the spirit and scope of the present disclosure. The substrate 2102 may be part of a singulated die (e.g., the die 2002 of FIG. 16B) or a wafer (e.g., the wafer 2000 of FIG. 16A).

The IC device 2100 may include one or more device layers 2104 disposed on the substrate 2102. The device layer 2104 may include features of one or more transistors 2140 (e.g., metal oxide semiconductor field-effect transistors (MOSFETs)) formed on the substrate 2102. The device layer 2104 may include, for example, one or more source and/or drain (S/D) regions 2120, a gate 2122 to control current flow in the transistors 2140 between the S/D regions 2120, and one or more S/D contacts 2124 to route electrical signals to/from the S/D regions 2120. Various transistors 2140 are not limited to the type and configuration depicted in FIG. 17 and may include a wide variety of other types and configurations such as, for example, planar transistors, non-planar transistors, or a combination of both. The transistors 2140 may include additional features not depicted for the sake of clarity, such as device isolation regions, gate contacts, and the like.

Each transistor 2140 may include a gate 2122 formed of at least two layers, a gate dielectric layer and a gate electrode layer. Generally, the gate dielectric layer of a transistor 2140 may include one layer or a stack of layers, and the one or more layers may include silicon oxide, silicon dioxide, and/or a high-k dielectric material. The high-k dielectric material included in the gate dielectric layer of the transistor 2140 may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one P-type work function metal or N-type work function metal, depending on whether the transistor 2140 is to be a P-type metal oxide semiconductor (PMOS) or an N-type metal oxide semiconductor (NMOS) transistor. In some implementations, the gate electrode may include a stack of two or more metal layers, where one or more metal layers are work function metal layers and at least one metal layer is a fill metal layer. Further metal layers may be included for other purposes, such as a barrier layer. For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross section of the transistor 2140 along the source-channel-drain direction, the gate electrode may include a U-shaped structure that includes a bottom portion substantially parallel to the surface of the substrate and two sidewall portions that are substantially perpendicular to the top surface of the substrate. In other embodiments, at least one of the metal layers that form the gate electrode may simply be a planar layer that is substantially parallel to the top surface of the substrate and does not include sidewall portions substantially perpendicular to the top surface of the substrate. In other embodiments, the gate electrode may include a combination of U-shaped structures and planar, non-U-shaped structures. For example, the gate electrode may include one or more U-shaped metal layers formed atop one or more planar, non-U-shaped layers. In some embodiments, the gate electrode may include a V-shaped structure (e.g., when the fin of a FinFET does not have a "flat" upper surface, but instead has a rounded peak).

In some embodiments, a pair of sidewall spacers may be formed on opposing sides of the gate stack to bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 2120 may be formed within the substrate 2102, e.g., adjacent to the gate of each transistor 2140. The S/D regions 2120 may be formed using an implantation/diffusion process or an etching/deposition process, for example. In the former process, dopants such as boron, aluminum, antimony, phosphorous, or arsenic may be ion-implanted into the substrate 2102 to form the S/D regions 2120. An annealing process that activates the dopants and causes them to diffuse farther into the substrate 2102 may follow the ion-implantation process. In the latter process, the substrate 2102 may first be etched to form recesses at the locations of the S/D regions 2120. An epitaxial deposition process may then be carried out to fill the recesses with material that is used to fabricate the S/D regions 2120. In some implementations, the S/D regions 2120 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 2120 may be formed using one or more alternate semiconductor materials such as germanium or a group III-V material or alloy. In further embodiments, one or more layers of metal and/or metal alloys may be used to form the S/D regions 2120.

Electrical signals, such as power and/or input/output (I/O) signals, may be routed to and/or from the transistors 2140 of the device layer 2104 through one or more interconnect layers disposed on the device layer 2104 (illustrated in FIG. 17 as interconnect layers 2106-2110). For example, electrically conductive features of the device layer 2104 (e.g., the gate 2122 and the S/D contacts 2124) may be electrically coupled with the interconnect structures 2128 of the interconnect layers 2106-2110. The one or more interconnect layers 2106-2110 may form an interlayer dielectric (ILD) stack 2119 of the IC device 2100.

The interconnect structures 2128 may be arranged within the interconnect layers 2106-1210 to route electrical signals according to a wide variety of designs (in particular, the arrangement is not limited to the particular configuration of interconnect structures 2128 depicted in FIG. 17). Although a particular number of interconnect layers 2106-1210 is depicted in FIG. 17, embodiments of the present disclosure include IC devices having more or fewer interconnect layers than depicted.

In some embodiments, the interconnect structures 2128 may include trench structures 2128*a* (sometimes referred to as "lines") and/or via structures 2128*b* (sometimes referred to as "holes") filled with an electrically conductive material such as a metal. The trench structures 2128*a* may be arranged to route electrical signals in a direction of a plane that is substantially parallel with a surface of the substrate 2102 upon which the device layer 2104 is formed. For example, the trench structures 2128*a* may route electrical signals in a direction in and out of the page from the perspective of FIG. 17. The via structures 2128*b* may be arranged to route electrical signals in a direction of a plane that is substantially perpendicular to the surface of the substrate 2102 upon which the device layer 2104 is formed. In some embodiments, the via structures 2128*b* may electrically couple trench structures 2128*a* of different interconnect layers 2106-2110 together.

The interconnect layers 2106-2110 may include a dielectric material 2126 disposed between the interconnect structures 2128, as shown in FIG. 17. In some embodiments, the dielectric material 2126 disposed between the interconnect structures 2128 in different ones of the interconnect layers 2106-2110 may have different compositions; in other embodiments, the composition of the dielectric material 2126 between different interconnect layers 2106-2110 may be the same.

A first interconnect layer 2106 (referred to as Metal 1 or "M1") may be formed directly on the device layer 2104. In some embodiments, the first interconnect layer 2106 may include trench structures 2128a and/or via structures 2128b, as shown. The trench structures 2128a of the first interconnect layer 2106 may be coupled with contacts (e.g., the S/D contacts 2124) of the device layer 2104.

A second interconnect layer 2108 (referred to as Metal 2 or "M2") may be formed directly on the first interconnect layer 2106. In some embodiments, the second interconnect layer 2108 may include via structures 2128b to couple the trench structures 2128a of the second interconnect layer 2108 with the trench structures 2128a of the first interconnect layer 2106. Although the trench structures 2128a and the via structures 2128b are structurally delineated with a line within each interconnect layer (e.g., within the second interconnect layer 2108) for the sake of clarity, the trench structures 2128a and the via structures 2128b may be structurally and/or materially contiguous (e.g., simultaneously filled during a dual-damascene process) in some embodiments.

A third interconnect layer 2110 (referred to as Metal 3 or "M3") (and additional interconnect layers, as desired) may be formed in succession on the second interconnect layer 2108 according to similar techniques and configurations described in connection with the second interconnect layer 2108 or the first interconnect layer 2106.

The IC device 2100 may include a solder resist material 2134 (e.g., polyimide or similar material) and one or more bond pads 2136 formed on the interconnect layers 2106-2110. The bond pads 2136 may be electrically coupled with the interconnect structures 2128 and configured to route the electrical signals of the transistor(s) 2140 to other external devices. For example, solder bonds may be formed on the one or more bond pads 2136 to mechanically and/or electrically couple a chip including the IC device 2100 with another component (e.g., a circuit board). The IC device 2100 may have other alternative configurations to route the electrical signals from the interconnect layers 2106-2110 than depicted in other embodiments. For example, the bond pads 2136 may be replaced by or may further include other analogous features (e.g., posts) that route the electrical signals to external components.

FIG. 18 is a side, cross-sectional view of an example IC package 2200 that may include one or more thermal contacts in accordance with any of the embodiments disclosed herein. In some embodiments, the IC package 2200 may be a system-in-package (SiP).

The package substrate 2252 may be formed of a dielectric material (e.g., a ceramic, a buildup film, an epoxy film having filler particles therein, etc.), and may have conductive pathways extending through the dielectric material between the face 2272 and the face 2274, or between different locations on the face 2272, and/or between different locations on the face 2274. These conductive pathways may take the form of any of the interconnect structures 2128 discussed above with reference to FIG. 17.

The package substrate 2252 may include conductive contacts 2263 that are coupled to conductive pathways 2262 through the package substrate 2252, allowing circuitry within the dies 2256 and/or the interposer 2257 to electrically couple to various ones of the conductive contacts 2264 (or to other devices included in the package substrate 2252, not shown).

The IC package 2200 may include an interposer 2257 coupled to the package substrate 2252 via conductive contacts 2261 of the interposer 2257, first-level interconnects 2265, and the conductive contacts 2263 of the package substrate 2252. The first-level interconnects 2265 illustrated in FIG. 18 are solder bumps, but any suitable first-level interconnects 2265 may be used. In some embodiments, no interposer 2257 may be included in the IC package 2200; instead, the dies 2256 may be coupled directly to the conductive contacts 2263 at the face 2272 by first-level interconnects 2265.

The IC package 2200 may include one or more dies 2256 coupled to the interposer 2257 via conductive contacts 2254 of the dies 2256, first-level interconnects 2258, and conductive contacts 2260 of the interposer 2257. The conductive contacts 2260 may be coupled to conductive pathways (not shown) through the interposer 2257, allowing circuitry within the dies 2256 to electrically couple to various ones of the conductive contacts 2261 (or to other devices included in the interposer 2257, not shown). The first-level interconnects 2258 illustrated in FIG. 18 are solder bumps, but any suitable first-level interconnects 2258 may be used. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, an underfill material 2266 may be disposed between the package substrate 2252 and the interposer 2257 around the first-level interconnects 2265, and a mold compound 2268 may be disposed around the dies 2256 and the interposer 2257 and in contact with the package substrate 2252. In some embodiments, the underfill material 2266 may be the same as the mold compound 2268. Example materials that may be used for the underfill material 2266 and the mold compound 2268 are epoxy mold materials, as suitable. Second-level interconnects 2270 may be coupled to the conductive contacts 2264. The second-level interconnects 2270 illustrated in FIG. 18 are solder balls (e.g., for a ball grid array arrangement), but any suitable second-level interconnects 22770 may be used (e.g., pins in a pin grid array arrangement or lands in a land grid array arrangement). The second-level interconnects 2270 may be used to couple the IC package 2200 to another component, such as a circuit board (e.g., a motherboard), an interposer, or another IC package, as known in the art and as discussed below with reference to FIG. 19.

In various embodiments, the IC package 2200 may include one or more thermal contacts as described herein. In particular, the IC package 2200 may include any one or more of thermal contacts 106 as shown in FIGS. 1-14. The number and location of thermal contacts 106 shown in FIGS. 1-14 is simply illustrative and, in general, any number of thermal contacts 106, with any suitable structure, and any suitable location at the periphery of the IC package 2200 may be included in the IC package 2200, e.g., provided on or over the package substrate 2252, or on or over the die 2256, as described above.

The dies 2256 may take the form of any of the embodiments of the die 2002 discussed herein (e.g., may include any of the embodiments of the IC device 2100). In embodiments in which the IC package 2200 includes multiple dies 2256, the IC package 2200 may be referred to as a multi-chip package (MCP). The dies 2256 may include circuitry to perform any desired functionality. For example, one or more of the dies 2256 may be logic dies (e.g., silicon-based dies), and one or more of the dies 2256 may be memory dies (e.g., high bandwidth memory). In some embodiments, the die 2256 may include one or more thermal contacts, e.g., as discussed with reference to some of FIGS. 1-14 and as discussed above with reference to FIG. 16 and FIG. 17); in other embodiments, the die 2256 may not include any thermal contacts.

Although the IC package 2200 illustrated in FIG. 18 is a flip chip package, other package architectures may be used. For example, the IC package 2200 may be a ball grid array (BGA) package, such as an embedded wafer-level ball grid array (eWLB) package. In another example, the IC package 2200 may be a wafer-level chip scale package (WLCSP) or a panel fan-out (FO) package. Although two dies 2256 are illustrated in the IC package 2200 of FIG. 18, an IC package 2200 may include any desired number of dies 2256. An IC package 2200 may include additional passive components, such as surface-mount resistors, capacitors, and inductors disposed on the first face 2272 or the second face 2274 of the package substrate 2252, or on either face of the interposer 2257. More generally, an IC package 2200 may include any other active or passive components known in the art.

Figure 19:
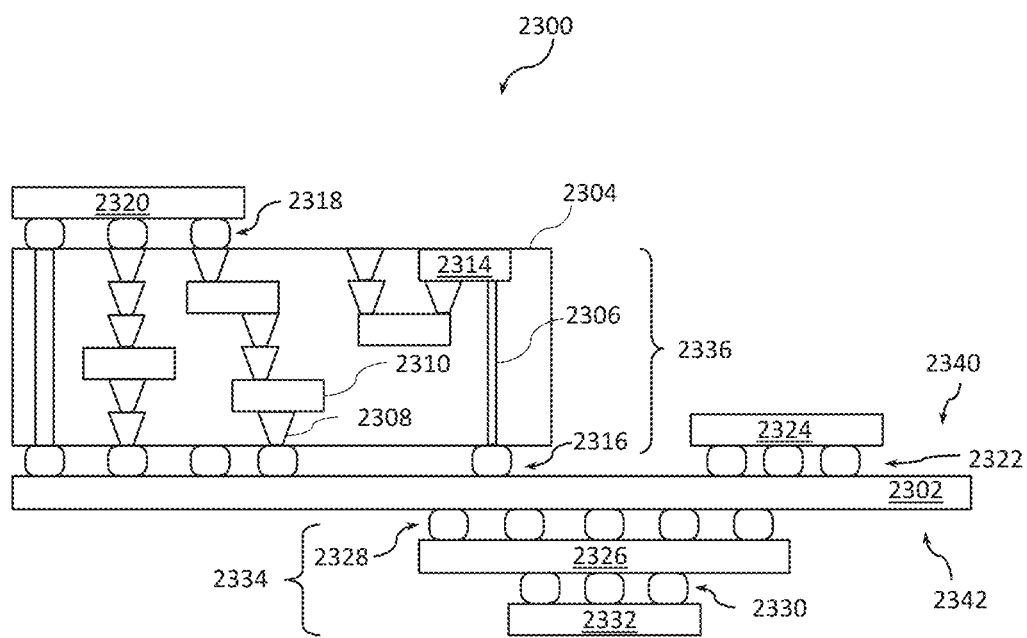
FIG. 19 is a cross-sectional side view of an IC device assembly that may include one or more thermal contacts in accordance with any of the embodiments disclosed herein.

FIG. 19 is a cross-sectional side view of an IC device assembly 2300 that may include components having one or more thermal contacts in accordance with any of the embodiments disclosed herein. The IC device assembly 2300 includes a number of components disposed on a circuit board 2302 (which may be, e.g., a motherboard). The IC device assembly 2300 includes components disposed on a first face 2340 of the circuit board 2302 and an opposing second face 2342 of the circuit board 2302; generally, components may be disposed on one or both faces 2340 and 2342. In particular, any suitable ones of the components of the IC device assembly 2300 may include any of the thermal contacts in accordance with any of the embodiments disclosed herein; e.g., any of the IC packages discussed below with reference to the IC device assembly 2300 may take the form of any of the embodiments of the IC package 2200 discussed above with reference to FIG. 18 (e.g., may include one or more thermal contacts 106 on/over/in a package substrate 2252 or on/over/in a die 2256).

In some embodiments, the circuit board 2302 may be a PCB including multiple metal layers separated from one another by layers of dielectric material and interconnected by electrically conductive vias. Any one or more of the metal layers may be formed in a desired circuit pattern to route electrical signals (optionally in conjunction with other metal layers) between the components coupled to the circuit board 2302. In other embodiments, the circuit board 2302 may be a non-PCB substrate.

The IC device assembly 2300 illustrated in FIG. 19 includes a package-on-interposer structure 2336 coupled to the first face 2340 of the circuit board 2302 by coupling components 2316. The coupling components 2316 may electrically and mechanically couple the package-on-interposer structure 2336 to the circuit board 2302, and may include solder balls (as shown in FIG. 19), male and female portions of a socket, an adhesive, an underfill material, and/or any other suitable electrical and/or mechanical coupling structure.

The package-on-interposer structure 2336 may include an IC package 2320 coupled to an interposer 2304 by coupling components 2318. The coupling components 2318 may take any suitable form for the application, such as the forms discussed above with reference to the coupling components 2316. The IC package 2320 may be or include, for example, a die (the die 2002 of FIG. 16B), an IC device (e.g., the IC device 2100 of FIG. 17), or any other suitable component. In particular, the IC package 2320 may include, or at least a portions of the IC package 2320 may be thermally coupled to, one or more thermal contacts as described herein. Although a single IC package 2320 is shown in FIG. 19, multiple IC packages may be coupled to the interposer 2304; indeed, additional interposers may be coupled to the interposer 2304. The interposer 2304 may provide an intervening substrate used to bridge the circuit board 2302 and the IC package 2320. Generally, the interposer 2304 may spread a connection to a wider pitch or reroute a connection to a different connection. For example, the interposer 2304 may couple the IC package 2320 (e.g., a die) to a BGA of the coupling components 2316 for coupling to the circuit board 2302. In the embodiment illustrated in FIG. 19, the IC package 2320 and the circuit board 2302 are attached to opposing sides of the interposer 2304; in other embodiments, the IC package 2320 and the circuit board 2302 may be attached to a same side of the interposer 2304. In some embodiments, three or more components may be interconnected by way of the interposer 2304.

The interposer 2304 may be formed of an epoxy resin, a fiberglass-reinforced epoxy resin, a ceramic material, or a polymer material such as polyimide. In some implementations, the interposer 2304 may be formed of alternate rigid or flexible materials that may include the same materials described above for use in a semiconductor substrate, such as silicon, germanium, and other group III-V and group IV materials. The interposer 2304 may include metal interconnects 2308 and vias 2310, including but not limited to through-silicon vias (TSVs) 2306. The interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. In particular, one or more thermal contacts as described herein may be thermally coupled to at least some of the embedded devices 2314. More complex devices such as radio frequency (RF) devices, power amplifiers, power management devices, antennas, arrays, sensors, and microelectromechanical systems (MEMS) devices may also be formed on the interposer 2304. The package-on-interposer structure 2336 may take the form of any of the package-on-interposer structures known in the art. In some embodiments, the interposer 2304 may include one or more thermal contacts as described herein.

The IC device assembly 2300 may include an IC package 2324 coupled to the first face 2340 of the circuit board 2302 by coupling components 2322. The coupling components 2322 may take the form of any of the embodiments discussed above with reference to the coupling components 2316, and the IC package 2324 may take the form of any of the embodiments discussed above with reference to the IC package 2320.

The IC device assembly 2300 illustrated in FIG. 19 includes a package-on-package structure 2334 coupled to the second face 2342 of the circuit board 2302 by coupling components 2328. The package-on-package structure 2334 may include an IC package 2326 and an IC package 2332 coupled together by coupling components 2330 such that the IC package 2326 is disposed between the circuit board 2302 and the IC package 2332. The coupling components 2328 and 2330 may take the form of any of the embodiments of the coupling components 2316 discussed above, and the IC packages 2326 and 2332 may take the form of any of the embodiments of the IC package 2320 discussed above. The package-on-package structure 2334 may be configured in accordance with any of the package-on-package structures known in the art.

FIG. 20 is a block diagram of an example computing device 2400 that may include one or more components with one or more thermal contacts in accordance with any of the embodiments disclosed herein. For example, any suitable ones of the components of the computing device 2400 may include a die (e.g., the die 2002 (FIG. 16B)) including, or thermally coupled to, one or more thermal contacts in accordance with any of the embodiments disclosed herein. Any one or more of the components of the computing device 2400 may include an IC device 2100 (FIG. 17) and/or an IC package 2200 (FIG. 18). Any one or more of the components of the computing device 2400 may include an IC device assembly 2300 (FIG. 19).

A number of components are illustrated in FIG. 20 as included in the computing device 2400, but any one or more of these components may be omitted or duplicated, as suitable for the application. In some embodiments, some or all of the components included in the computing device 2400 may be attached to one or more motherboards. In some embodiments, some or all of these components are fabricated onto a single system-on-a-chip (SoC) die.

Additionally, in various embodiments, the computing device 2400 may not include one or more of the components illustrated in FIG. 20, but the computing device 2400 may include interface circuitry for coupling to the one or more components. For example, the computing device 2400 may not include a display device 2406, but may include display device interface circuitry (e.g., a connector and driver circuitry) to which a display device 2406 may be coupled. In another set of examples, the computing device 2400 may not include an audio input device 2418 or an audio output device 2408, but may include audio input or output device interface circuitry (e.g., connectors and supporting circuitry) to which an audio input device 2418 or audio output device 2408 may be coupled.

The computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. The processing device 2402 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices. The computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, the memory 2404 may include memory that shares a die with the processing device 2402. This memory may be used as cache memory and may include embedded dynamic random access memory (eDRAM) or spin transfer torque magnetic random access memory (STT-MRAM).

In some embodiments, the computing device 2400 may include a communication chip 2412 (e.g., one or more communication chips). For example, the communication chip 2412 may be configured for managing wireless communications for the transfer of data to and from the computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

The communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication chip 2412 may operate in accordance with other wireless protocols in other embodiments. The computing device 2400 may include an antenna 2422 to facilitate wireless communications and/or to receive other wireless communications (such as AM or FM radio transmissions).

In some embodiments, the communication chip 2412 may manage wired communications, such as electrical, optical, or any other suitable communication protocols (e.g., the Ethernet). As noted above, the communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

The computing device 2400 may include battery/power circuitry 2414. The battery/power circuitry 2414 may include one or more energy storage devices (e.g., batteries or capacitors) and/or circuitry for coupling components of the computing device 2400 to an energy source separate from the computing device 2400 (e.g., AC line power).

The computing device 2400 may include a display device 2406 (or corresponding interface circuitry, as discussed above). The display device 2406 may include any visual indicators, such as a heads-up display, a computer monitor, a projector, a touchscreen display, a liquid crystal display (LCD), a light-emitting diode display, or a flat panel display, for example.

The computing device 2400 may include an audio output device 2408 (or corresponding interface circuitry, as discussed above). The audio output device 2408 may include any device that generates an audible indicator, such as speakers, headsets, or earbuds, for example.

The computing device 2400 may include an audio input device 2418 (or corresponding interface circuitry, as discussed above). The audio input device 2418 may include any device that generates a signal representative of a sound, such as microphones, microphone arrays, or digital instruments (e.g., instruments having a musical instrument digital interface (MIDI) output).

The computing device 2400 may include a GPS device 2416 (or corresponding interface circuitry, as discussed above). The GPS device 2416 may be in communication with a satellite-based system and may receive a location of the computing device 2400, as known in the art.

The computing device 2400 may include an other output device 2410 (or corresponding interface circuitry, as discussed above). Examples of the other output device 2410 may include an audio codec, a video codec, a printer, a wired or wireless transmitter for providing information to other devices, or an additional storage device.

The computing device 2400 may include an other input device 2420 (or corresponding interface circuitry, as discussed above). Examples of the other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

The computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, the computing device 2400 may be any other electronic device that processes data.

SELECT EXAMPLES

The following paragraphs provide various examples of the embodiments disclosed herein.

Example 1 provides an IC package that includes a package substrate, an IC die (or a plurality of IC dies, possibly stacked upon one another) coupled to the package substrate, and a thermal contact for coupling to, or for receiving, a heat exchanger. The thermal contact is provided in, or limited to being in, a region located at a periphery (i.e., at the outer limits or edge) of the IC package.

Example 2 provides the IC package according to example 1, where the thermal contact is thermally coupled to (i.e., is able to exchange heat with) at least one of the package substrate and the IC die, e.g., by being attached, e.g., using an adhesive, soldered, wirebond connected (e.g., using a relatively thick metal wire, e.g., an Al wire), to at least one of the package substrate and the IC die.

Example 3 provides the IC package according to examples 1 or 2, where the thermal contact includes a contact surface for thermally coupling (i.e., for enabling heat exchange between) the thermal contact and the heat exchanger, the contact surface being substantially parallel to (and facing away from) a plane of the package substrate. In other words, the thermal contact may be such that the heat exchanger can be coupled to the top face (or, phrased differently, the upper surface) of the thermal contact.

Example 4 provides the IC package according to example 3, further including a mold provided over one or more upper surfaces of the IC die and the package substrate except for the contact surface of the thermal contact. In some such examples, a thermal conductivity of the thermal contact may be higher than a thermal conductivity of the mold.

Example 5 provides the IC package according to examples 1 or 2, where the thermal contact includes a contact surface for thermally coupling (i.e., for enabling heat exchange between) the thermal contact and the heat exchanger, the contact surface being substantially perpendicular to (and facing away from) a plane of the package substrate. In other words, the thermal contact may be such that the heat exchanger can be coupled to the side face (or, phrased differently, the lateral edge) of the thermal contact.

Example 6 provides the IC package according to examples 1 or 2, where the thermal contact includes a first contact surface and a second contact surface, each of the first and second contacts surfaces for thermally coupling (i.e., for enabling heat exchange between) the thermal contact and the heat exchanger, where the first contact surface is substantially parallel to (and facing away from) a plane of the package substrate and the second contact surface is substantially perpendicular to (and facing away from) the plane of the package substrate. In other words, the thermal contact may be such that the heat exchanger can be coupled to both the top and side faces of the thermal contact.

Example 7 provides the IC package according to examples 1 or 2, where the thermal contact forms an opening for coupling to at least a portion of the heat exchanger (i.e., the thermal contact may be shaped as a slot into which at least a portion of the heat exchanger is to be inserted).

Example 8 provides the IC package according to any one of the preceding examples, where a distance between the package substrate and an upper surface of the thermal contact (i.e., the surface of the thermal contact that is substantially parallel to and farthest away from the package substrate) is equal to or less than a distance between the package substrate and an upper surface of the IC die (i.e., the surface of the IC die that is substantially parallel to and farthest away from the package substrate). Such an embodiment may help ensure that the presence of the thermal contact does not substantially add to the z-height of the IC package besides what is required for including the IC die.

Example 9 provides the IC package according to any one of the preceding examples, where a distance between the package substrate and an upper surface of the thermal contact (i.e., the surface of the thermal contact that is substantially parallel to and farthest away from the package substrate) is equal to or less than a distance between the package substrate and an upper surface of a mold provided over one or more upper surfaces of the IC die and the package substrate (i.e., the surface of the mold that is substantially parallel to and farthest away from the package substrate). Such an embodiment may also help ensure that the presence of the thermal contact does not substantially add to the z-height of the IC package besides what is required for including the IC die, now for the case of an overmolded package where the thermal contact may use some of the additional space the mold cap provides.

Example 10 provides the IC package according to any one of the preceding examples, where the thermal contact is such that, when the heat exchanger is thermally coupled to the thermal contact, an upper surface of the heat exchanger (i.e., the surface of the heat exchanger that is substantially parallel to and farthest away from the package substrate) does not extend beyond an upper surface of the IC package (i.e., the surface of the IC package, without the heat exchanger, that is substantially parallel to and farthest away from the package substrate) by more than about 100 nanometers. Preferably, the upper surface of the heat exchanger is below the upper surface of the IC package. Thus, the thermal contact may be such that it allows coupling to a heat exchanger in a manner that does not substantially add to the z-height of the IC package together with the heat exchanger.

Example 11 provides the IC package according to any one of the preceding examples, where the IC die is one of a plurality of IC dies stacked to one another, and where the thermal contact is thermally coupled to one or more of the plurality of IC dies (e.g., to an IC die that is closest to the package substrate).

Example 12 provides the IC package according to any one of the preceding examples, where at least a portion of the thermal contact is in a recess in the IC die.

Example 13 provides the IC package according to any one of the preceding examples, where at least a portion of the thermal contact is in a recess in a mold provided over one or more upper surfaces of the IC die and the package substrate.

Example 14 provides the IC package according to any one of the preceding examples, where the region at the periphery (i.e., the region to which the thermal contact is limited to) includes a closed-contour extending along the periphery of the IC package.

Example 15 provides the IC package according to any one of examples 1-14, where the thermal contact is a frame provided at the edges of the package substrate. In some examples, such a frame may extend to the edges of the IC die as well.

Example 16 provides the IC package according to any one of examples 1-14, where the thermal contact is a frame provided at the edges of the IC die. In some examples, such a frame may extend to portions of the package substrate as well.

Example 17 provides the IC package according to any one of the preceding examples, where the thermal contact includes silicon.

Example 18 provides the IC package according to any one of the preceding examples, where the thermal contact includes one or more metals, e.g., copper.

Example 19 provides the IC package according to any one of the preceding examples, where the heat exchanger includes one or more of: a heat spreader, a heat pipe, solid or liquid TIMs, thermal fluids, graphite or metal tapes, graphite or metal sheets, and thermal grease.

Example 20 provides the IC package according to any one of the preceding examples, where a thermal conductivity of the thermal contact is higher than a thermal conductivity of a dielectric material of the package substrate. In various embodiments, the thermal conductivity of the thermal contact may also be higher than that of at least some of various other materials that may appear in a package, such as a mold cap, an adhesive tape, a backside protection tape, etc.

Example 21 provides a method of manufacturing an IC package, the method including providing a package substrate; providing one or more IC dies coupled to the package substrate; and providing a thermal contact for coupling to a heat exchanger, the thermal contact enclosed within a region located at a periphery (i.e., at the outer limits or edge) of the IC package and thermally coupled to one or more of the package substrate and the one or more IC dies.

Example 22 provides the method according to example 21, the method further including performing thinning of one or more of the package substrate and the one or more dies to form one or more recesses, where providing the thermal contact includes providing at least one or more portions of the thermal contact in the one or more recesses. In further embodiments, the method may further include performing thinning of, or providing one or more recesses in, the mold cap and/or of the backside protection tape.

Example 23 provides the method according to examples 21 or 22, the method further including providing a mold over the IC package.

Example 24 provides an IC package that includes a package substrate and an IC die (or a plurality of IC dies, possibly stacked upon one another) coupled to the package substrate, where a portion of the IC die is thinner than at least one other portion, preferably thinner than all other portions, of the IC die, said portion providing/comprising a thermal contact area for coupling to at least a portion of a heat exchanger.

Example 25 provides the IC package according to example 24, where the thermal contact area is provided in, or limited to being in, a region located at a periphery (i.e., at the outer limits or edge) of the IC package.

Example 26 provides the IC package according to example 25, where the region at the periphery (i.e., the region to which the thermal contact is limited to) is a closed-contour region at the periphery of the IC package.

Example 27 provides the IC package according to example 25, where the thermal contact area is shaped as, or forms, a frame provided at the edges of the IC die.

Example 28 provides the IC package according to any one of examples 24-27, where said portion of the IC die includes a semiconductor material. Semiconductor materials, e.g., silicon, typically have sufficiently high thermal conductivity to effectively serve as a thermal contact for coupling to a heat exchanger.

Example 29 provides the IC package according to any one of examples 24-28, where the thermal contact area is a contact surface for thermally coupling (i.e., for enabling heat exchange between) the IC die and the portion of the heat exchanger, the contact surface being substantially parallel to (and facing away from) a plane of the package substrate. In other words, the thermal contact area is such that the heat exchanger can be coupled to the top face (or, phrased differently, the upper surface) of the thinned portion of the IC die.

Example 30 provides the IC package according to any one of examples 24-29, further including a mold provided over one or more upper surfaces of the IC die and the package substrate except for the thermal contact area. In some such examples, a thermal conductivity of the thermal contact area may be higher than a thermal conductivity of the mold.

Example 31 provides the IC package according to any one of examples 24-30, where said portion of the IC die is thinner than the other portions of the IC die so that, when the heat exchanger is thermally coupled to the thermal contact area, an upper surface of the heat exchanger (i.e., the surface of the heat exchanger that is substantially parallel to and farthest away from the package substrate) does not extend beyond an upper surface of the IC package (i.e., the surface of the IC package, without the heat exchanger, that is substantially parallel to and farthest away from the package substrate) by more than about 100 nanometers. Preferably, the upper surface of the heat exchanger is below the upper surface of the IC package. Thus, said portion of the IC die is thinned so that it allows coupling to a heat exchanger in a manner that does not substantially add to the z-height of the IC package together with the heat exchanger.

Example 32 provides an IC package that includes a package substrate and an IC die (or a plurality of IC dies, possibly stacked upon one another) coupled to the package substrate, where the IC die includes an opening for coupling to at least a portion of the heat exchanger (i.e., the IC die includes an opening shaped as a slot into which at least a portion of the heat exchanger is to be inserted).

Example 33 provides the IC package according to example 32, where the opening is on a side surface of the IC die. Such an embodiment is e.g., shown in FIGS. 13 and 14.

Example 34 provides the IC package according to examples 32 or 33, further including a mold provided over one or more upper surfaces of the IC die and the package substrate. The mold may not obstruct the opening so that the heat exchanger can be inserted into the opening.

Example 35 provides the IC package according to example 32, where the opening is on a top surface of the IC die. Such an embodiment is now shown in FIGS.

Example 36 provides the IC package according to example 35, further including a mold provided over one or more upper surfaces of the IC die and the package substrate except for the opening.

Example 37 provides the IC package according to any one of examples 32-36, where a portion of the IC die that includes the opening is thinner than at least one other portion, preferably thinner than all other portions, of the IC die.

Example 38 provides the IC package according to any one of examples 32-37, where the IC die includes a semiconductor material. Semiconductor materials, e.g., silicon, typically have sufficiently high thermal conductivity to effectively serve as a thermal contact for coupling to a heat exchanger.

Example 39 provides the IC package according to any one of examples 32-38, where inner sidewalls of the opening provide one or more contact surfaces for thermally coupling (i.e., for enabling heat exchange between) the IC die and the heat exchanger.

Example 40 provides a computing device that includes an IC package and a heat exchanger. The IC package includes a package substrate, an IC die, coupled to the package substrate, and a thermal contact, thermally coupled to one or more of the package substrate and the IC die. The heat exchanger is thermally coupled to the thermal contact so that an upper surface of the heat exchanger (i.e., the surface of the heat exchanger that is substantially parallel to and farthest away from the package substrate) is below an upper surface of the IC package (i.e., the surface of the IC package, without the heat exchanger, that is substantially parallel to and farthest away from the package substrate), e.g., at least 100 nm below. Thus, the thermal contact is such that it allows coupling to a heat exchanger in a manner that does not add to the z-height of the IC package together with the heat exchanger.

Example 41 provides a computing device that includes an IC package according to any one of examples 1-20 and 24-39, and a heat exchanger that is thermally coupled to the IC package.

Example 42 provides the computing device according to example 41, where the IC package includes, or is included in, a server processor.

Example 43 provides the computing device according to example 41, where the computing device is a wearable computing device (e.g., a smart watch) or handheld computing device (e.g., a mobile phone).

Example 44 provides the computing device according to any one of examples 41-43, where the computing device further includes one or more communication chips and an antenna.

The above description of illustrated implementations of the disclosure, including what is described in the Abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:
1. An integrated circuit (IC) package, comprising:
a package substrate;
an IC die coupled to the package substrate, an upper surface of the IC die comprising a first portion and a different second portion;
a thermal contact for coupling to at least a portion of a heat exchanger, the thermal contact in a region at a periphery of the IC package, a lower surface of the thermal contact comprising a third portion and a different fourth portion; and
a mold over the first portion of the upper surface of the IC die in plan view and directly under the third portion of the lower surface of the thermal contact,
wherein:
the thermal contact comprises a thermally conductive material,
the fourth portion of the lower surface of the thermal contact overlaps the second portion of the upper surface of the IC die,
the mold extends to a first distance over the upper surface of the IC die,
the thermal contact extends to a second distance over the upper surface of the IC die,
the second distance is less than the first distance,
the mold over the first portion of the upper surface of the IC die has a first side surface perpendicular to the upper surface of the IC die,
the thermal contact has a second side surface perpendicular to the upper surface of the IC die, and
the first side surface of the mold is in direct contact with the second side surface of the thermal contact.
2. The IC package according to claim 1, wherein the thermal contact is thermally coupled with the IC die.
3. The IC package according to claim 1, wherein the thermal contact includes a contact surface for thermally coupling the thermal contact and the portion of the heat exchanger, the contact surface being substantially parallel to a plane of the package substrate.

4. The IC package according to claim 3, wherein the mold is over one or more upper surfaces of the package substrate in plan view.

5. The IC package according to claim 1, wherein the thermal contact includes a contact surface for thermally coupling the thermal contact and the portion of the heat exchanger, the contact surface being substantially perpendicular to a plane of the package substrate.

6. The IC package according to claim 1, wherein the thermal contact includes an opening for receiving at least a portion of the heat exchanger.

7. The IC package according to claim 1, wherein a distance between the package substrate and an upper surface of the thermal contact is equal to or less than a distance between the package substrate and an upper surface of a mold over one or more upper surfaces of the IC die and the package substrate.

8. The IC package according to claim 1, wherein the thermal contact is such that, when the heat exchanger is thermally coupled to the thermal contact, an upper surface of the heat exchanger does not extend beyond an upper surface of the IC package by more than 100 nanometers.

9. The IC package according to claim 1, wherein the IC die is one of a plurality of IC dies stacked to one another, and wherein the thermal contact is thermally coupled to one or more of the plurality of IC dies.

10. The IC package according to claim 1, wherein the thermal contact is a frame at edges of the package substrate or at edges of the IC die.

11. The IC package according to claim 1, wherein the thermal contact includes silicon.

12. The IC package according to claim 1, wherein the thermal contact includes one or more metals.

13. An integrated circuit (IC) package, comprising:
a package substrate;
an IC die coupled to the package substrate, the IC die comprising a first portion and a different second portion, the second portion being thinner than the first portion;
a thermal contact, a lower surface of the thermal contact overlapping an upper surface of the second portion of the IC die; and
a backside protection layer over an upper surface of the first portion of the IC die,
wherein:
the first portion of the IC die has a first side surface perpendicular to the upper surface of the second portion of the IC die,
the thermal contact has a second side surface perpendicular to the upper surface of the second portion of the IC die,
the first side surface is in direct contact with the second surface,
the thermal contact comprises a thermally conductive material,
the lower surface of the thermal contact does not overlap the first portion of the IC die in plan view, and
the backside protection layer does not overlap the thermal contact in plan view.

14. The IC package according to claim 13, wherein a thermal contact area for coupling to at least a portion of a heat exchanger is in a region at a periphery of the IC package, wherein the region at the periphery is a closed-contour region at the periphery of the IC package.

15. The IC package according to claim 13, wherein the second portion of the IC die includes a semiconductor material.

16. The IC package according to claim 13, wherein the upper surface of the second portion of the IC die comprises a contact surface for thermally coupling the IC die and a portion of a heat exchanger, the contact surface being substantially parallel to a plane of the package substrate.

17. The IC package according to claim 13, further comprising a mold over one or more upper surfaces of the package substrate.

18. An integrated circuit (IC) package, comprising:
a package substrate;
an IC die coupled to the package substrate, an upper surface of the IC die comprising a first portion and a different second portion coplanar with the first portion;
a thermal contact for coupling to at least a portion of a heat exchanger, the thermal contact in a region at a periphery of the IC package, a lower surface of the thermal contact comprising a third portion and a different fourth portion; and
a first mold over the first portion of the upper surface of the IC die in plan view, the first mold covering a smaller area than the first portion of the upper surface of the IC die in plan view;
a second mold directly under the third portion of the lower surface of the thermal contact in plan view,
wherein:
the thermal contact comprises a thermally conductive material,
the fourth portion of the lower surface of the thermal contact overlaps the second portion of the upper surface of the IC die,
the first mold has a first side surface perpendicular to the upper surface of the IC die,
the thermal contact has a second side surface perpendicular to the upper surface of the IC die, and
the first side surface of the first mold is in direct contact with the second side surface of the thermal contact.

19. The IC package of claim 18, wherein:
the thermal contact surrounds the first mold, and
the second mold surrounds the IC die.

20. The IC package of claim 18, further comprising an attach layer between the thermal contact and the IC die.

21. The IC package of claim 18, further comprising a heat exchanger coupled to the thermal contact.

22. An integrated circuit (IC) package, comprising:
a package substrate;
an IC die coupled to the package substrate, an upper surface of the IC die comprising a first portion and a different second portion;
a thermal contact for coupling to at least a portion of a heat exchanger, a lower surface of the thermal contact comprising a third portion and a different fourth portion; and
a mold over the first portion of the upper surface of the IC die in plan view and directly under the third portion of the lower surface of the thermal contact,
wherein:
the thermal contact comprises a thermally conductive material,
the fourth portion of the lower surface of the thermal contact overlaps the second portion of the upper surface of the IC die,
the mold over the first portion of the upper surface of the IC die has a first side surface perpendicular to the upper surface of the IC die, the thermal contact has a second side surface perpendicular to the upper surface of the IC die, the first side surface of the mold is in direct contact with the second side surface of the thermal contact, the thermal contact has a third side surface opposite to the second side surface, and the third side surface has a cavity to accommodate a heat exchanger.

23. The IC package of claim 22, wherein the heat exchanger extends beyond the third side surface of the thermal contact.

24. The IC package of claim 22, wherein:

the thermal contact is on a first side of the IC die, the IC die has wire bonds on a second side opposite to the first side.

25. The IC package of claim 22, wherein the thermal contact is shorter than the IC die in plan view.

\* \* \* \* \*